US008799560B2

(12) United States Patent
Hanzawa

(10) Patent No.: US 8,799,560 B2
(45) Date of Patent: Aug. 5, 2014

(54) SEMICONDUCTOR DEVICE

(75) Inventor: Satoru Hanzawa, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 187 days.

(21) Appl. No.: 13/389,260

(22) PCT Filed: Jun. 18, 2010

(86) PCT No.: PCT/JP2010/060369
§ 371 (c)(1),
(2), (4) Date: Feb. 6, 2012

(87) PCT Pub. No.: WO2011/021432
PCT Pub. Date: Feb. 24, 2011

(65) Prior Publication Data
US 2012/0137058 A1    May 31, 2012

(30) Foreign Application Priority Data

Aug. 21, 2009  (JP) .................................. 2009-191588

(51) Int. Cl.
*G06F 12/00* (2006.01)
(52) U.S. Cl.
USPC .................................. 711/103; 711/E12.008
(58) Field of Classification Search
USPC .......................................... 711/103, E12.008
See application file for complete search history.

(56) References Cited

U.S. PATENT DOCUMENTS

| 7,889,544 | B2 * | 2/2011 | Chow et al. ................... 365/163 |
| 2004/0027901 | A1 | 2/2004 | Shiga et al. |
| 2006/0215440 | A1 | 9/2006 | Cho et al. |
| 2010/0211725 | A1 | 8/2010 | Nagashima et al. |

FOREIGN PATENT DOCUMENTS

| JP | 6-44789 A | 2/1994 |
| JP | 11-154393 A | 6/1999 |
| JP | 2004-022112 A | 1/2004 |
| JP | 2006-269062 A | 10/2006 |
| JP | 2007-213179 A | 8/2007 |
| JP | 2008-059053 A | 3/2008 |
| JP | 2009-099200 A | 5/2009 |

OTHER PUBLICATIONS

Office Action issued Feb. 5, 2013, in Japanese Patent Application No. 2011-527606.

(Continued)

*Primary Examiner* — Reginald Bragdon
*Assistant Examiner* — Mehdi Namazi
(74) *Attorney, Agent, or Firm* — Miles & Stockbridge P.C.

(57) ABSTRACT

A high-speed large-capacity phase-change memory is achieved. A semiconductor device according to the present invention includes: a plurality of memory planes MP; a plurality of storage information register groups SDRBK paired with the plurality of memory planes; and a chip control circuit CPCTL. The plurality of memory planes include a plurality of memory cells. Also, the plurality of storage information register groups temporarily retain information to be stored in the plurality of memory planes. Further, the chip control circuit includes a register which temporarily stores a value indicating volume of the storage information, and a first storage information volume is smaller than a second storage information volume. When the first storage information volume is written, the plurality of memory planes and the plurality of storage information register groups are activated during a first period. When the second storage information volume is written, the plurality of memory planes and the plurality of storage information register groups are activated during a second period. By such a structure, the first period is shorter than the second period.

17 Claims, 19 Drawing Sheets

(56) References Cited

OTHER PUBLICATIONS

Kwang-Jin Lee et al., "A 90nm 1.8V 512Mb Diode-Switch PRAM with 266MB/s Read Throughput", IEEE International Solid-State Circuits Conference, Digest of Technical papers, U.S.A. 2007, pp. 472-473.

R. F. Freitas et al., "Storage-class memory: The next storage system technology", IBM Journal of Research and Development, U.S.A., Jul./Sep. 2008, pp. 439-447.

* cited by examiner

FIG. 2

| Command | Symbol | |
|---|---|---|
| | First cycle | Second cycle |
| 2-k Byte program | PGL1 | PGL2 |
| 512-Byte program | PGS1 | PGS2 |
| 2-k Byte Read | RDL1 | RDL2 |
| 512-Byte Read | RDS1 | RDS2 |
| Read status register | RDS | — |
| Block erase | BE1 | BE2 |

SEMICONDUCTOR DEVICE

TECHNICAL FIELD

The present invention relates to a semiconductor device, and, more particularly, the present invention relates to an effective technique for a storage device including a memory cell formed of an element having a resistance value varying in accordance with storage information.

BACKGROUND ART

Currently, there are a NAND-type flash memory and a NOR-type flash memory as a memory which retains a program or a data in a nonvolatile state.

In the NAND-type flash memory having features of large-volume and high-speed data transfer, a memory-cell occupancy is improved by reducing an area size of an area where a bit line and a memory cell are connected to each other, and therefore, a read/write operating time (for one access, time until the access ends) is long. That is, since a so-called NAND string in which memory cells are connected in series is a basic structure, an RC delay in a read/write current path is large (here, "R" mainly indicates a wiring resistance of the NAND string or a global bit line and "C" indicates a parasitic capacity). Also, a data with a small information volume cannot be written in a short period of time because a so-called block erase operation which collectively erases a region wider than those of the read/write operations is required, and besides, because an operation method as writing information of several kilobytes in a long period of time is adopted. Meanwhile, the number of memory cells connected to one word line is large, and the number of memory cells which can be read and written in parallel to each other is large. Therefore, it has a structure that a data written from outside is temporarily buffered. Because of such a structure, when the written data is inputted from outside, a data of 2 kilobytes is continuously inputted, and therefore, it can be said that the data transfer efficiency is high.

On the other hand, in the NOR-type flash memory with high input/output speed, in order to reduce the read/write time, the memory cells are connected to a bit line in parallel, and besides, a length of the bit line is suppressed. Because of such a memory array structure, the RC delay in the read/write current path is reduced (here, "R" mainly indicates a wiring resistance of the bit line, and "C" mainly indicates a capacity which parasitizes the bit line). Meanwhile, a total area size of the areas where the bit line and the memory cell are connected to each other is larger than that of the NAND-type flash memory, and therefore, an integration degree is low. In this manner, in the conventional flash memory, the NAND type is used for a demand of the large-volume data transfer, and the NOR type is used for a demand of the short read/write time. Therefore, as the data volume to be handled for one access, 2 kilobytes and 1 to 2 bytes are fixed in the NAND type and the NOR type in accordance with the features of their memories, respectively.

Meanwhile, Patent Document 1 has been published regarding flash memories with different write units. The flash memories according to the document include: program-storage flash memories FLP_A (5) and FLP_AB (6); and a data-storage flash memory FLD9. When a program of 256 bytes is written therein, both of the FLP_A (5) and the FLP_AB (6) are accessed for a continuous space in the program-storage flash memories. On the other hand, when a data of 128 bytes is written therein, only the FLD9 is accessed.

Further, as a next-generation nonvolatile memory, a phase-change memory having a structure different from those of the conventional NAND type and NOR type and using a recording layer made of a chalcogenide material and a diode has been suggested. In a storage element of the phase-change memory which has been currently studied, a chalcogenide material (or a phase-change material) such as a Ge—Sb—Te based material or a Ag—In—Sb—Te based material in which at least antimony (Sb) and tellurium (Te) are contained is used as a material of the recording layer. Also, the diode is used as a selection element. In this manner, the characteristics of the phase-change memory using the chalcogenide material and the diode are described in, for example, FIG. 2 of Non-Patent Document 1.

PRIOR ART DOCUMENT

Patent Document

PATENT DOCUMENT 1: Japanese Patent Application Laid-Open Publication No. 2008-59053

Non-Patent Documents

NON-PATENT DOCUMENT 1: IEEE International Solid-State Circuits Conference, Digest of Technical Papers, U.S.A, 2007, pages 472 to 473

NON-PATENT DOCUMENT 2: IBM Journal of Research and Development, U.S.A, July/September 2008, pages 439 to 447

DISCLOSURE OF THE INVENTION

Problems to be Solved by the Invention

Here, there are two demands for the conventional memories. A first demand is to increase the rewrite data transfer rate. For example, according to Non-Patent Document 2 which discusses a performance of a next-generation solid-state storage, in a computer system requiring a large computation volume such as used for biotechnology, structural engineering, or meteorological forecasting, a storage having a high write data transfer rate is required. Meanwhile, a second demand is to increase the input/output speed, that is, to reduce the read/write operating time for an unspecified address. According to the above document, in a computer system specializing in massive-volume data analysis such as data searching, cryptanalysis, applied image processing, or multi-language analysis, a storage capable of quick read/write operation from/to an unspecified address is required. However, the conventional flash memories are separately used depending on each usage as described above, and therefore, a flash memory whose performance is matched with both demands has not been suggested. Also, the handled data volume has been currently increased, and therefore, a large-capacity nonvolatile memory is desired.

However, as described above, the increase in the data transfer rate and the reduction in the read/write time which are the first and the second demands are performance indexes which are difficult to be balanced in the conventional NAND-type large-capacity flash memory, and are difficult to be satisfied at the same time. This is because the memory has the array structure which pursues the specific performance.

And, Patent Document 1 has also studied that, in order to write the data with the small information volume in the short period of time, the memory is separated into the program-storage flash memory and the data-storage flash memory to increase a data size written to the program-storage flash memory.

However, its idea is to control two memories with different write units by one controller. Therefore, since the memories are fixedly allocated thereto depending on the data type, a different-type data cannot be written and read to/from the memory, and, as a result, a problem that the memory capacity cannot be effectively used arises. Also, since the usage is limited, it is difficult to obtain a mass production effect as same as those of a semiconductor chip for communication and an image-processing semiconductor chip, and therefore, there is a risk of increase in a chip unit price. Accordingly, it is desired that any data can be read and written within the operation time in accordance with the information volume without separating the memory area. However, a method for achieving the above-described demands has not been suggested.

Means for Solving the Problems

A summary of a typical aspect of the inventions disclosed in the present application is briefly described as follows. A semiconductor device includes: a memory plane which includes a plurality of bit lines, a plurality of word lines crossing the plurality of bit lines, and a plurality of memory cells arranged at predetermined crossing points of the plurality of bit lines and the plurality of word lines; an input buffer to which an operation setting command, a data, and an address are inputted, the operation setting command indicating a rewrite mode for the memory plane, the data being stored in the plurality of memory cells, and the address corresponding to the data; a memory area control circuit which controls to write the data into the memory plane in accordance with the address inputted to the input buffer; and a page size register which is set as a first rewrite mode or a second rewrite mode in accordance with the operation setting command inputted to the input buffer. In the semiconductor device, the memory plane includes a first information storage area and a second information storage area. First access cycle time is shorter than second access cycle time, the first access cycle time taken from input of the operation setting command in the case that the page size register is set as the first rewrite mode, followed by end of the rewrite operation into the memory plane, until input of a next operation setting command, and the second access cycle time taken from input of the operation setting command in the case that the page size register is set as the second rewrite mode, followed by end of the rewrite operation into the memory plane, until input of a next operation setting command. The memory area control circuit writes the data into the first information storage area in a case that the page size register is set as the first rewrite mode and an address indicating the first information storage area is inputted to the input buffer, and the memory area control circuit writes the data into the first information storage area and the second information storage area in a case that the page size register is set as the second rewrite mode and an address indicating the first information storage area is inputted to the input buffer.

Also, as viewed from another aspect, the present invention is described as follows. A semiconductor device includes: a first memory plane which includes a plurality of first global bit lines, a plurality of first bit-line selection circuits connected respectively to the plurality of first global bit lines, a plurality of first bit lines connected respectively to the plurality of first bit-line selection circuits, a plurality of first word lines crossing the plurality of first bit lines, and a plurality of first memory cells arranged at predetermined crossing points of the plurality of first bit lines and the plurality of first word lines; a plurality of first write driving circuits connected to the plurality of first global bit lines; an input buffer to which a rewrite command and a data are inputted, the rewrite command indicating a rewrite mode for the first memory plane, and the data being stored in the plurality of first memory cells; a first storage information register group which is connected to the plurality of first write driving circuits and which includes a first small-scale storage information register group and a second small-scale storage information register group for temporarily retaining the data inputted to the input buffer; and a page size register which is set as a first rewrite mode or a second rewrite mode in accordance with the rewrite command. In the semiconductor device, a data volume retained in the first storage information register group in the case that the page size register is set as the first rewrite mode is smaller than a data volume retained in the first storage information register group in the case that the page size register is set as the second rewrite mode. In the case that the page size register is set as the first rewrite mode, the data inputted to the input buffer is stored in the first small-scale storage information register group, and is transferred from the first small-scale storage information register group to the plurality of first write driving circuits. In the case that the page size register is set as the second rewrite mode, the data inputted to the input buffer is stored in the first small-scale storage information register group and the second small-scale storage information register group, and is transferred from the first small-scale storage information register group to the plurality of first write driving circuits, and then, is transferred from the second small-scale storage information register group to the plurality of first write driving circuits.

Effects of the Invention

When the effects obtained by typical aspects of the invention disclosed in the present application is briefly described, a convenient memory can be achieved.

BRIEF DESCRIPTIONS OF THE DRAWINGS

FIG. 2 is a diagram showing a list of commands used for the phase-change memory shown in FIG. 1;

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, while a circuit element configuring each functional block of the embodiments is not particularly limited, they are formed on a semiconductor substrate made of single-crystal silicon or others through a publicly-known integrated circuit technique such as CMOS (complementary MOS transistor). Further, a memory cell configuring each memory plane of the embodiments is a memory cell such as a phase-change memory using a memory cell which stores information by using a change in a state of a chalcogenide material and detects a difference between resistance values depending on the information to discriminate the information, or a memory cell such as an ReRAM (Resistive Random Access Memory) and an MRAM (Magnetresistive Random Access Memory) not requiring the block erase operation.

First Embodiment

In the present embodiment, an example of a chip structure of a phase-change memory having two rewrite operation modes and two read operation modes in accordance with the information volume is described. Hereinafter, as one example, it is assumed that a first rewrite operation mode is a 2-kilobyte rewrite mode and a second rewrite operation mode is a 512-byte rewrite mode. Similarly, it is assumed that a first read operation mode is a 2-kilobyte read mode and a second read operation mode is a 512-byte read mode. Note that the storage information volume to be handled in the first mode is larger than the storage information volume to be handled in the second mode. Hereinafter, in order to facilitate the explanation, it is assumed that the storage information volume to be handled in the first mode is 2 kilobytes which is a value equal to an operation unit of a conventional NAND-type flash memory. It is assumed that the storage information volume to be handled in the second mode is 512 bytes which is a value equal to the information volume called a sector in a hard disk drive (HDD).

<<Chip Structure>>

Figure 1:
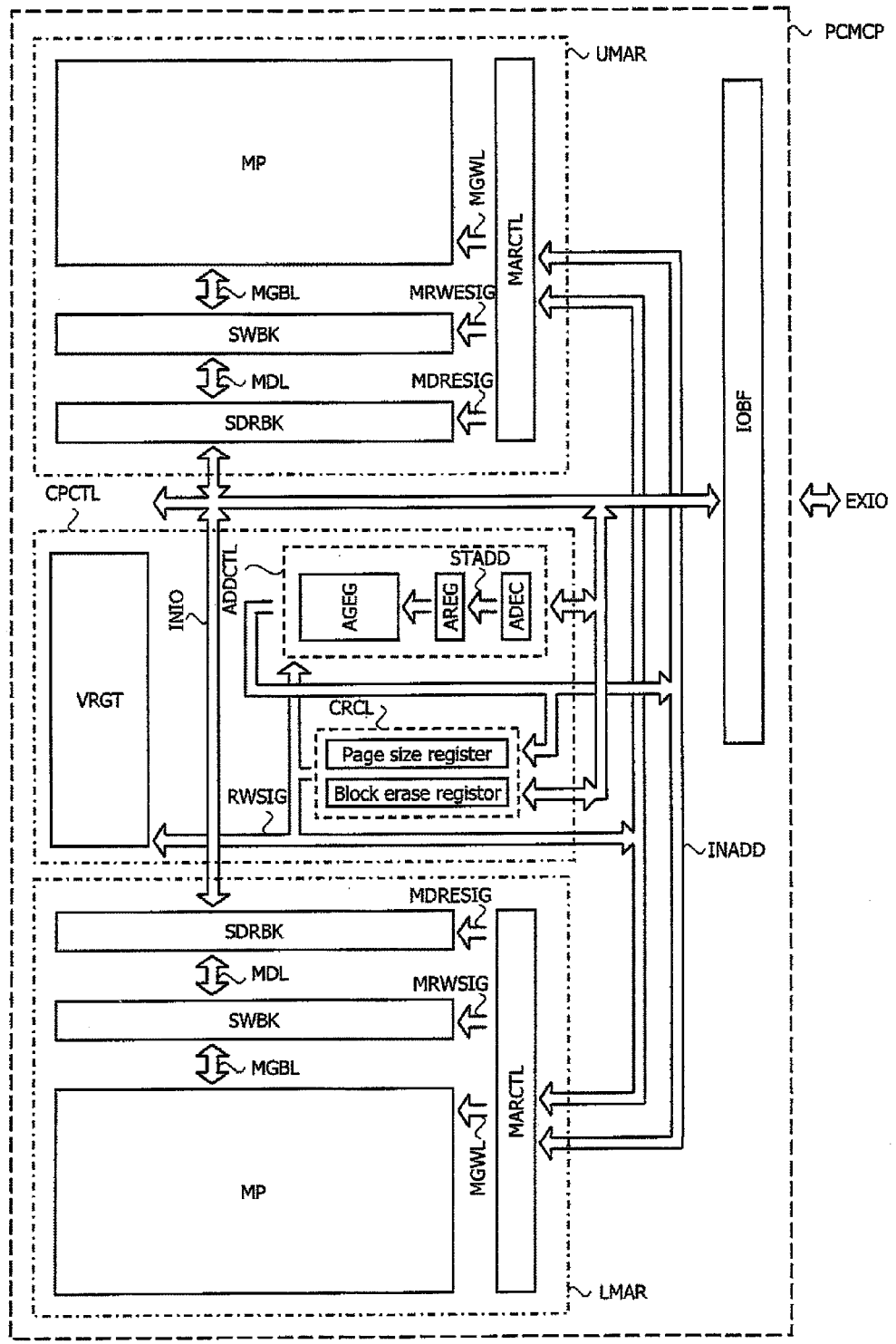
FIG. 1 is a diagram showing an example of a structure of principal-part circuit blocks of a phase-change memory in a semiconductor device of a first embodiment of the present invention.

FIG. 1 shows an example of a structure of principal-part circuit blocks of a phase-change memory PCMCP according to the present embodiment. The phase-change memory PCMCP in this drawing is roughly configured of: an input/output buffer IOBF; two memory areas; and a peripheral circuit. The input/output buffer IOBF is arranged between an external input/output line EXIO of the phase-change memory and an internal input/output line INIO of the phase-change memory, and bi-directionally exchanges the storage information or others. Hereinafter, the description is made with assuming that the number of input/output lines is eight. The storage information volume exchanged at once is eight bits (=one byte).

The memory area is separated into an upper memory area UMAR and a lower memory area LMAR. Each of these two memory areas is configured of: a memory plane MP; a sense latch/rewrite driving circuit group SWBK; a storage information register group SDRBK; and a memory-area control circuit MARCTL. The memory plane MP has a structure in which a plurality of memory cells each configured of one diode and a resistive element using one phase-change material are arranged in an array. The information stored in the memory plane MP is written from the sense latch/rewrite driving circuit group SWBK via a global bit line group MGBL. Alternatively, the information stored in the memory plane MP is read to the sense latch/rewrite driving circuit group SWBK via the global bit line group MGBL. As shown in the drawing, by separating the memory area into two and arranging a circuit group (which will be described in detail later) required for the read/write operations in each area, the two memory areas can be simultaneously operated in parallel, and therefore, the larger number of memory cells can be read and written by one selecting operation.

The storage information register group SDRBK is a circuit block performing a parallel-serial or serial-parallel conversion as temporarily storing the information to be stored in the memory plane MP. The storage information register group SDRBK is connected to the sense latch/rewrite driving circuit group SWBK via a data line group MDL. Also, the storage information register group SDRBK is connected to the input/output buffer IOBF via the internal input/output line INIO of the phase-change memory.

The sense latch/rewrite driving circuit SWBK includes a plurality of sense latches having a function of discriminating, amplifying, and further temporality storing a weak signal read from the memory plane MP in the read operation. Also, it includes a plurality of rewrite driving circuits having a function of applying a rewrite pulse in accordance with the information temporarily stored in the storage information register group SDRBK to a selected memory cell in the rewrite operation.

The memory area control circuit MARCTL is a circuit block which generates three signals for controlling the internal circuit blocks of the memory area in accordance with an internal address INADD and a read/write control signal RWSIG inputted from a chip control circuit CPCTL which will be described later. A first signal is a signal for a global-word-line signal group MGWL for selectively activating word lines in the memory plane MP. A second signal is a read/write start signal group MRWESIG for selectively activating the sense latch/rewrite driving circuit group SWBK. A third signal is a storage-information-register start signal group MDRESIG for controlling the storage information register group SDRBK.

The chip control circuit CPCTL is configured of: an address control circuit ADDCTL; a command register/control logic circuit CRCL; and a voltage generation circuit VRGT. The address control circuit ADDCTL includes: an address decoder ADEC; a start address register AREG; and an internal address generation circuit AGEN of the chip. The address decoder ADEC decodes each of a start row address signal and a start column address signal received from the internal input/output line INIO of the phase-change memory, and generates an internal start address STADD of the chip. This start address STADD is temporarily stored in a start address register AREG. The internal address generation circuit AGEN of the phase-change memory generates an internal address INADD of the phase-change memory in accordance with the start address STADD and a read/write control signal RWSIG which will be described later. The internal address INADD is inputted to each memory area and the command register/control logic circuit CRCL which will be described later.

The command register/control logic circuit CRCL exchanges a command signal with the internal input/output line INIO of the phase-change memory, and temporarily stores the received command signal. Also, it generates a signal for controlling internal units of the phase-change memory, that is, a read/write control signal RWSIG, in accordance with the received command signal and the internal address INADD described above. The command register/control logic circuit CRCL in the drawing receives the command signal in accordance with a page size shown in FIG. 2, and temporarily stores a value in accordance with the page size into a page size register. In other words, in accordance with the command shown in FIG. 2, the 2-kilobyte rewrite mode and the 512-byte rewrite mode are set to the page size register. With using this information, the control logic circuit CRCL generates the read/write control signal RWSIG which is activated during only a period in accordance with the page size.

Although details of an operation will be described in detail later, in the phase-change memory according to the present invention, two command signals are inputted as shown in FIG. 2 to perform one operation. However, only one command signal may be used. According to FIG. 2, in the case of the 2-kilobyte rewriting, a command signal PGL1 is inputted in a first cycle, and a command signal PGL2 is inputted in a second cycle. In the case of the 512-byte rewriting, a command signal PGS1 is inputted in the first cycle, and a command signal PGS2 is inputted in the second cycle. In the case of the 2-kilobyte reading, a command signal RDL1 is inputted in the first cycle, and a command signal RDL2 is inputted in the second cycle. In the case of the 512-byte reading, a command signal RDS1 is inputted in the first cycle, and a command signal RDS2 is inputted in the second cycle. As a typical example of reading the information temporarily stored in the command register, note that an operation-state read command signal RDS is inputted when an operation-state register is read.

The voltage generation circuit VRGT is a circuit which controls an internal voltage of the phase-change memory in accordance with a signal received via the internal input/output line INIO of the phase-change memory and the read/write control signal RWSIG. For example, in the case of the read operation, in order to prevent data corruption in the selected memory cell, it generates a read voltage lower than that of a system power supply (which is omitted in the drawing). Alternatively, in the case of the rewrite operation, in order to exactly cause the phase change in the selected memory cell, it generates a rewrite voltage equal to or higher than that of the system power supply.

<<Structure of Memory Area>>

Figure 3:
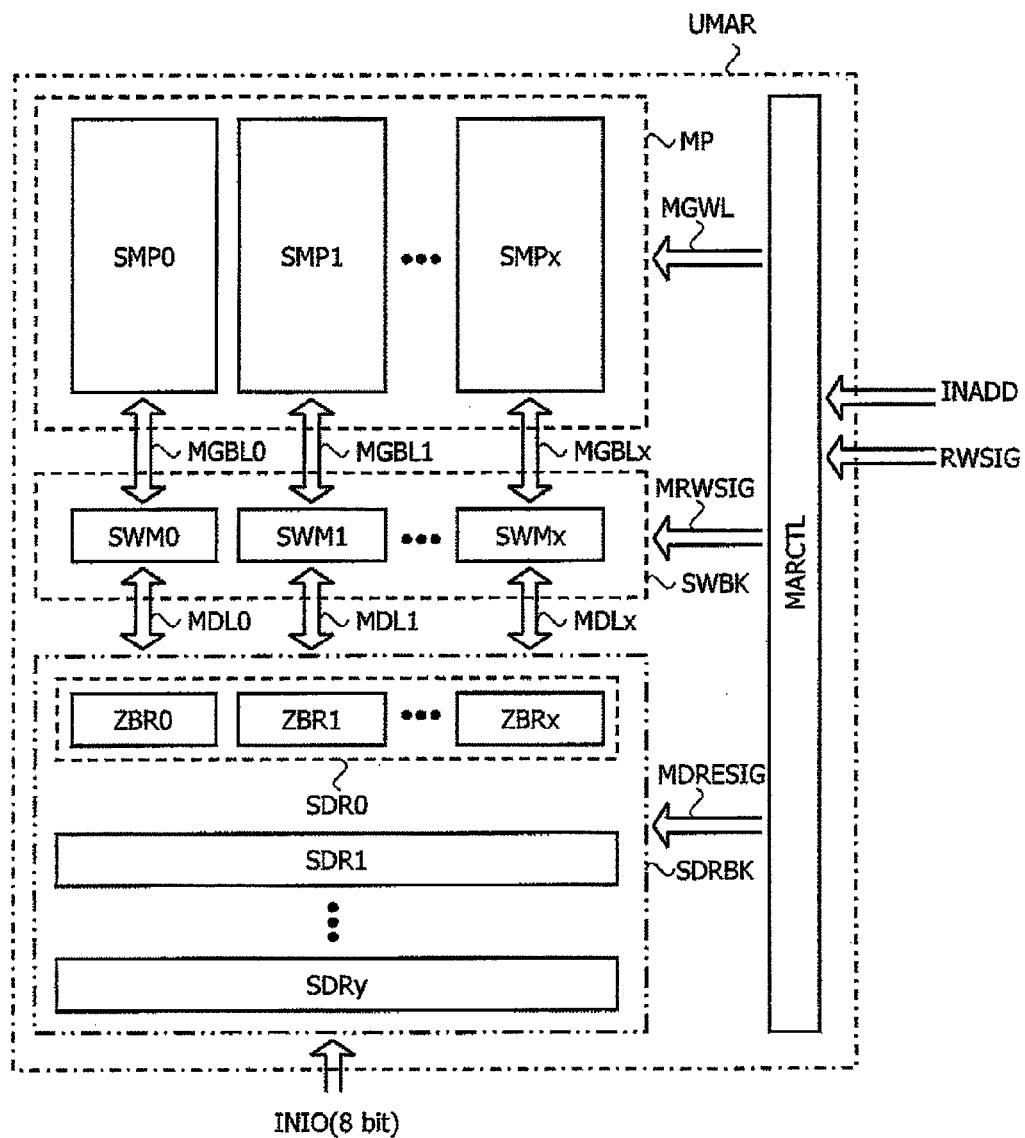
FIG. 3 is a diagram showing an example of a structure of principal-part circuit blocks of an upper memory area in the phase-change memory shown in FIG. 1.
Figure 4:
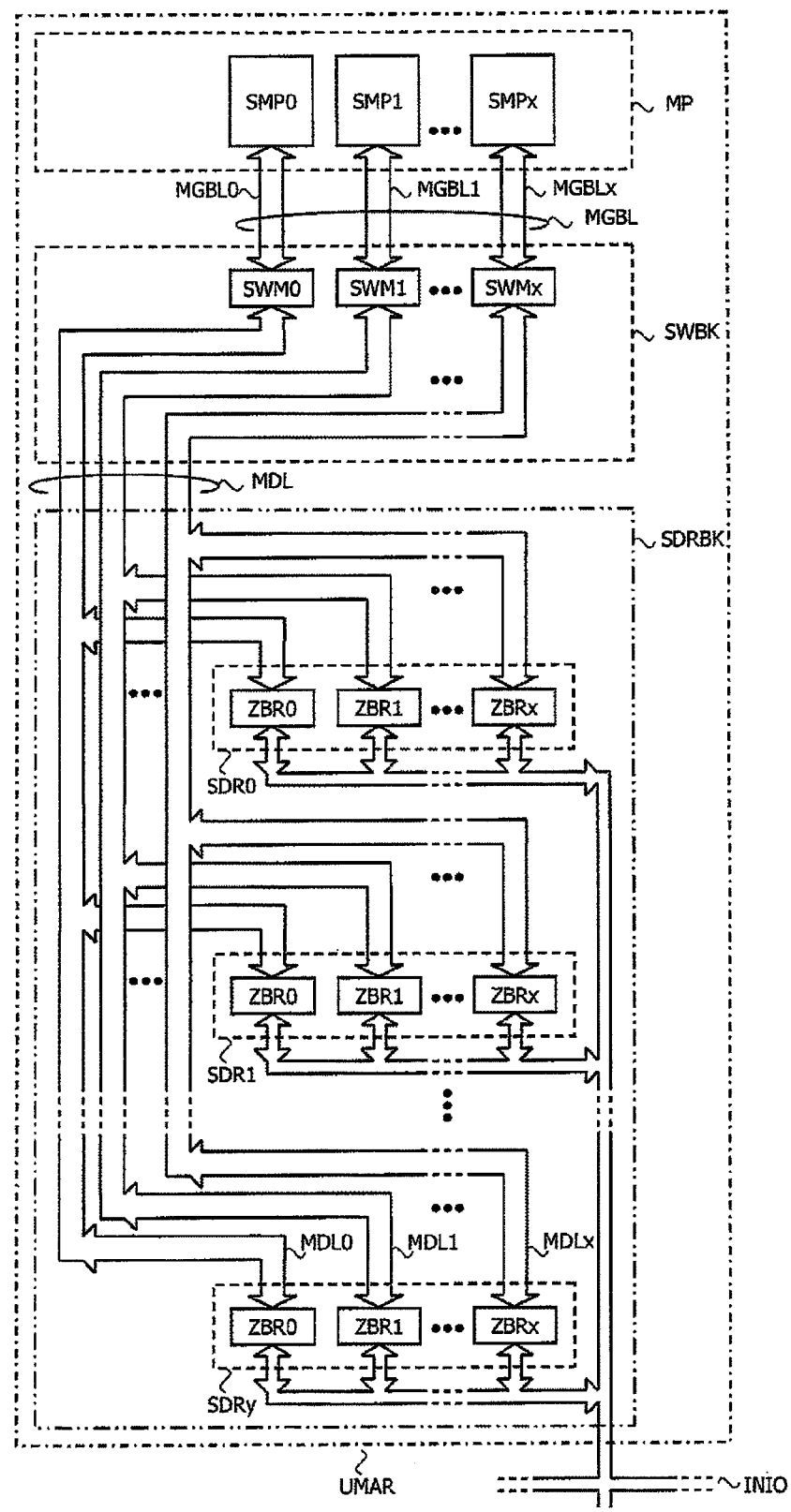
FIG. 4 is a diagram showing an example of a wiring structure for connecting the principal-part circuit blocks in the upper memory area shown in FIG. 3.
Figure 5:
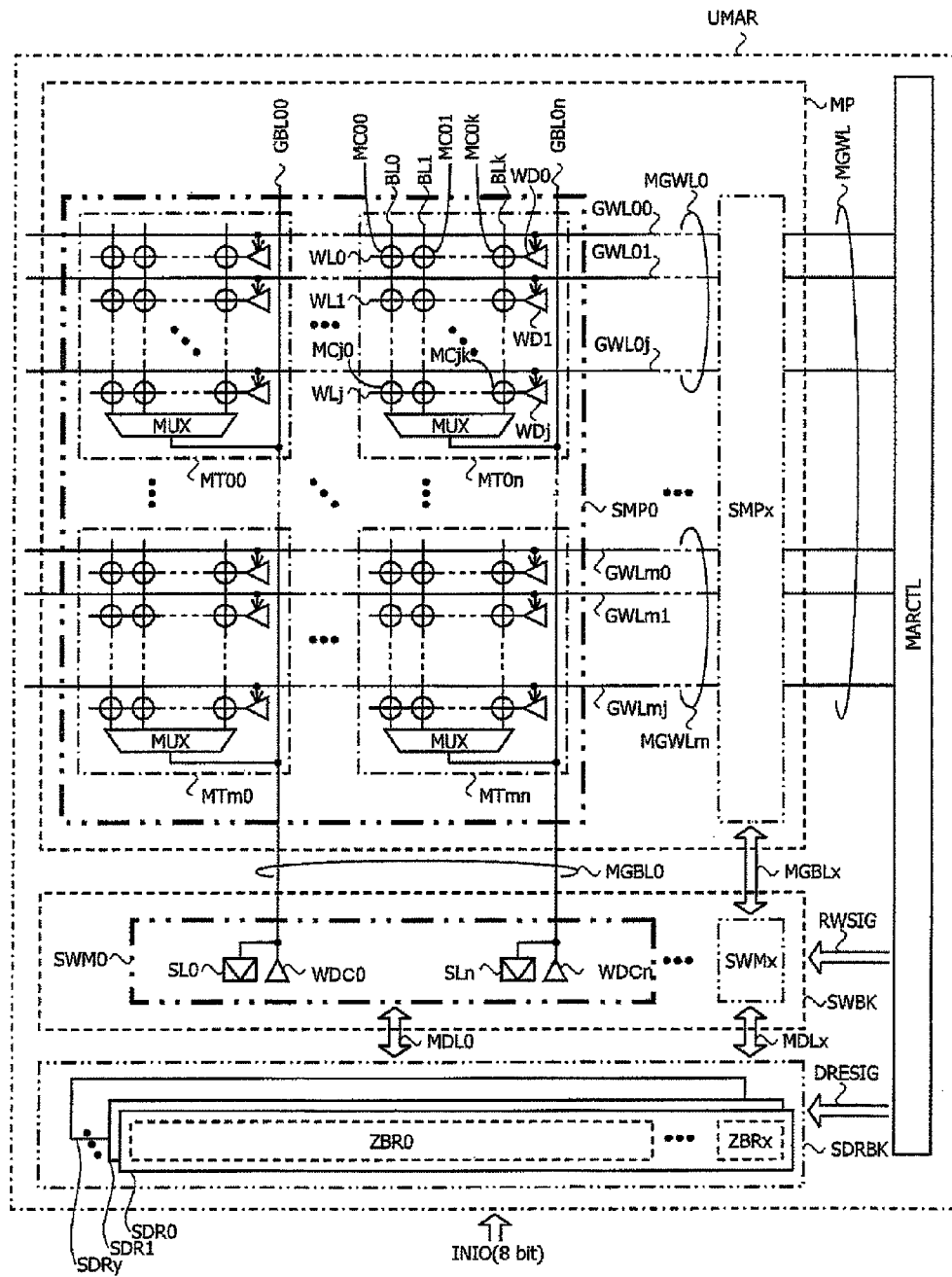
FIG. 5 is a diagram showing an example of a specific structure of the principal-part circuit blocks in the upper memory area shown in FIG. 4.

Next, with reference to FIGS. 3 to 5, the structures of the memory areas shown in FIG. 1 are described in detail. FIG. 3 shows the structure of the circuit blocks of the upper memory area UMAR. As described later, a feature of the drawing is that the memory plane MP is logically divided into (x+1) small-scale memory planes SMP0 to SMPx, and, in accordance with the division, the sense latch/rewrite driving circuit group SWBK and the storage information register group SDRBK are also logically divided into (x+1) circuit blocks.

The sense latch/rewrite driving circuit group SWBK is configured of (x+1) small-scale sense latch/rewrite driving circuit groups SWM0 to SWMx. These small-scale sense latch/rewrite driving circuit groups SWM0 to SWMx are circuit groups which read and rewrite the storage information with the corresponding small-scale memory planes SMP0 to SMPx. These small-scale sense latch/rewrite driving circuit groups SWM0 to SWMx are connected to the small-scale memory planes SMP0 to SMPx via small-scale global bit line groups MGBL0 to MGBLx, respectively.

The storage information register group SDRBK is configured of (y+1) small-scale storage information register groups SDR0 to SDRy. Each of these small-scale storage information register groups SDR0 to SDRy is configured of (x+1) z-byte registers ZBR0 to ZBRx. Each of these z-byte registers ZBR0 to ZBRx is a circuit group for temporarily storing the information which has been stored in the corresponding small-scale memory planes SMP0 to SMPx. The small-scale storage information register groups SDR0 to SDRy are connected to sense latch/rewrite driving circuit groups SWBK0 to SWBKx via common data line groups MDL0 to MDLx, respectively. More specifically, the z-byte registers ZBR0 to ZBRx in each of the small-scale storage information registers SDR0 to SDRy are connected to the small-scale sense latch/rewrite driving circuit groups SWM0 to SWMx via the corresponding small-scale data line groups MDL0 to MDLx as shown in FIG. 4, respectively. Here, the small-scale data line groups MDL0 to MDLx are components of the data line group MDL shown in FIG. 1. Also, although details will be described later, by arranging the storage information register group SDRBK in each of the memory areas UMAR and LMAR in the phase-change memory shown in FIG. 1, a large volume of the storage information can be continuously read and written.

FIG. 5 shows the structure of each circuit block in the upper memory area UMAR in detail. As represented by the small-scale memory plane SMP0 in the drawing, each of the small-scale memory planes SMP0 to SMPx is configured of memory tiles MT00 to MTmn which are arranged in a matrix of "m+1" rows and "n+1" columns. These (m+1)×(n+1) memory tiles MT00 to MTmn are arranged at crossing points of (m+1) small-scale global word line groups MGWL0 to MGWLm with (n+1) small-scale global bit line groups MGBL0 to MGBLx, respectively. Here, the (m+1) sets of small-scale global word line groups MGWL0 to MGWLm are components of the global word line group MGWL. Also, the (n+1) sets of small-scale global bit line groups MGBL0 to MGBLx are components of the global bit line group MGBL.

As represented by the memory tile MT0n, each of the memory tiles MT00 to MTmn is configured of: memory cells MC00 to MCjk which are arranged in a matrix of (j+1) rows and (k+1) columns; a bit-line selection circuit MUX; and (j+1) word drivers WD0 to WDj. These (j+1)×(k+1) memory cells MC00 to MCjk are arranged at crossing points of the (j+1) word lines WL0 to WLj and the (k+1) bit lines BL0 to BLk, respectively. The bit-line selection circuit MUX is arranged between the (k+1) bit lines BL0 to BLk and a global bit line GBL0n, and connects one bit line selected from the (k+1) bit lines BL0 to BLk to the global bit line GBL0n. The word drivers WD0 to WDj are arranged between the word lines WL0 to WLj and the global word lines GWL01 to GWL0j (that is, the small-scale global word line group MGWL0). The word driver in accordance with one global word line selected from the global word lines GWL01 to GWL0j is activated, so that one of the (j+1) word lines WL0 to WLj is selected to supply a desired voltage. By providing this structure as described above, in one memory tile, the number of memory cells to be rewritten is one. Therefore, in the phase-change memory having such a structure, by suppressing the number of memory cells driven by one word driver or one rewrite driving circuit for rewriting the information through a current, these circuits can be configured small, so that the memory-cell occupancy can be improved.

In the sense latch/rewrite driving circuit group SWBK, each of the (x+1) small-scale sense latch/rewrite driving circuit groups SWM0 to SWMx is configured of (n+1) pairs of sense latches (SL0 to SLn) and rewrite driving circuits (WDC0 to WDCn) such as a pair of the sense latch SL0 and the rewrite driving circuit WDC0 in the small-scale sense latch/rewrite driving circuit group SWM0. These pairs of sense latch/rewrite driving circuits are arranged at (n+1) global bit lines GBL00 to GBL0n, respectively (that is, the small-scale global bit line MGBL0). Note that, as shown in FIG. 4, for example, as the small-scale sense latch/rewrite driving circuit group SWM0, each of the (n+1) pairs of sense latch/rewrite driving circuits is connected via the small-scale data line group MDL0 to the z-byte register ZBR0 in the small-scale storage information register groups SDR0 to SDRy inside the storage information register group SDRBK.

<<Summary of 2-Kilobyte Rewrite Operation>>

Figure 6:
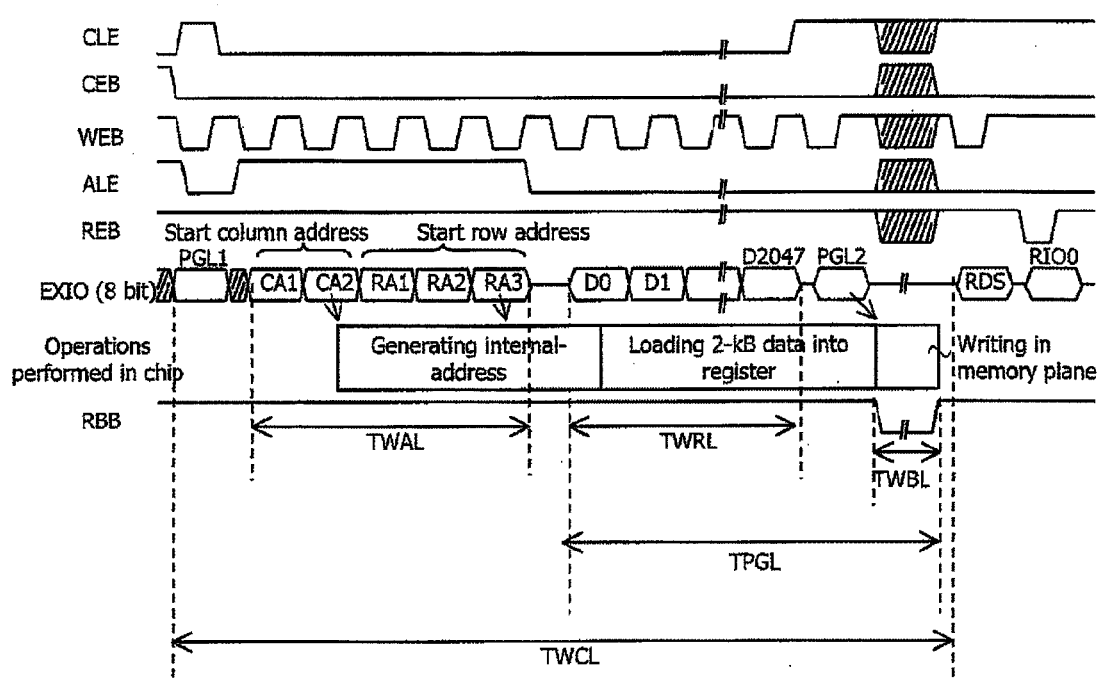
FIG. 6 is a diagram showing an example of a 2-kilobyte rewrite operation of the phase-change memory shown in FIG. 1.

FIG. 6 shows an example of the 2-kilobyte rewrite operation. A command latch start signal CLE which is at a low level is driven to a high level, and a chip start signal CEB and an address latch start signal ALE which are at a high level are driven to a low level. Then, a first 2-kilobyte write command signal PGL1 is inputted via the external input/output line EXIO. This command signal PGL1 is loaded into the phase-change memory chip at a rising edge of a write start signal WEB.

Next, the command latch start signal CLE which is at the high level is driven to the low level, and the address latch start signal ALE which is at the low level is driven to the high level, so that start column addresses and start row addresses are separately and sequentially inputted twice (CA1 and CA2) and three times (RA1, RA2, and RA3), respectively. These addresses are loaded into the phase-change memory chip at the rising edge of the write start signal WEB. Note that the input of the column addresses twice and the row addresses three times complies with a standard of a FLASH memory, and an address length different from them may be inputted in a different sequence.

Subsequently, the address latch start signal ALE which is at the high level is driven to the low level, so that every 8 bits of the 2-kilobyte storage information D0 to D2047 are inputted from the external input/output line EXIO. Further, the command latch start signal CLE which is at the low level is driven to the high level, so that a second rewrite command signal PGL2 is inputted from the external input/output line EXIO. This second rewrite command signal PGL2 is loaded into the phase-change memory chip at the rising edge of the write start signal WEB, so that the rewrite operation is performed. At this time, a ready/busy signal RBB which is at a high level is driven to a low level. After end of the rewrite operation, the ready/busy signal RBB which is at the low level is driven to the high level. Here, it is assumed that time taken from the input start of the storage information D0 until the end of the rewrite operation is indicated by 2-kilobyte rewrite operation time TPGL. And, it is assumed that access cycle time TWCL indicates time containing address input time TWAL taken when the start column address and the start row address are inputted, data storage time TWRL taken when the storage information is stored in the small-scale storage information register group, and busy time TWBL taken when the ready/busy signal RBB is driven at the low level. Most of the 2-kilobyte rewrite operation time TPGL is configured of the data storage time TWRL and the busy time TWBL.

Finally, in order to verify whether the rewrite operation has been succeeded or not, a state read command signal RDS is inputted. The state read command signal RDS is loaded into the chip at the rising edge of the rewrite start signal WEB. Then, a state RIO0 after the rewriting is outputted in synchronization with a read start signal REB from the external input/output line EXIO.

<<Temporarily Storing Operation in 2-Kilobyte Rewrite Operation>>

Figure 7:
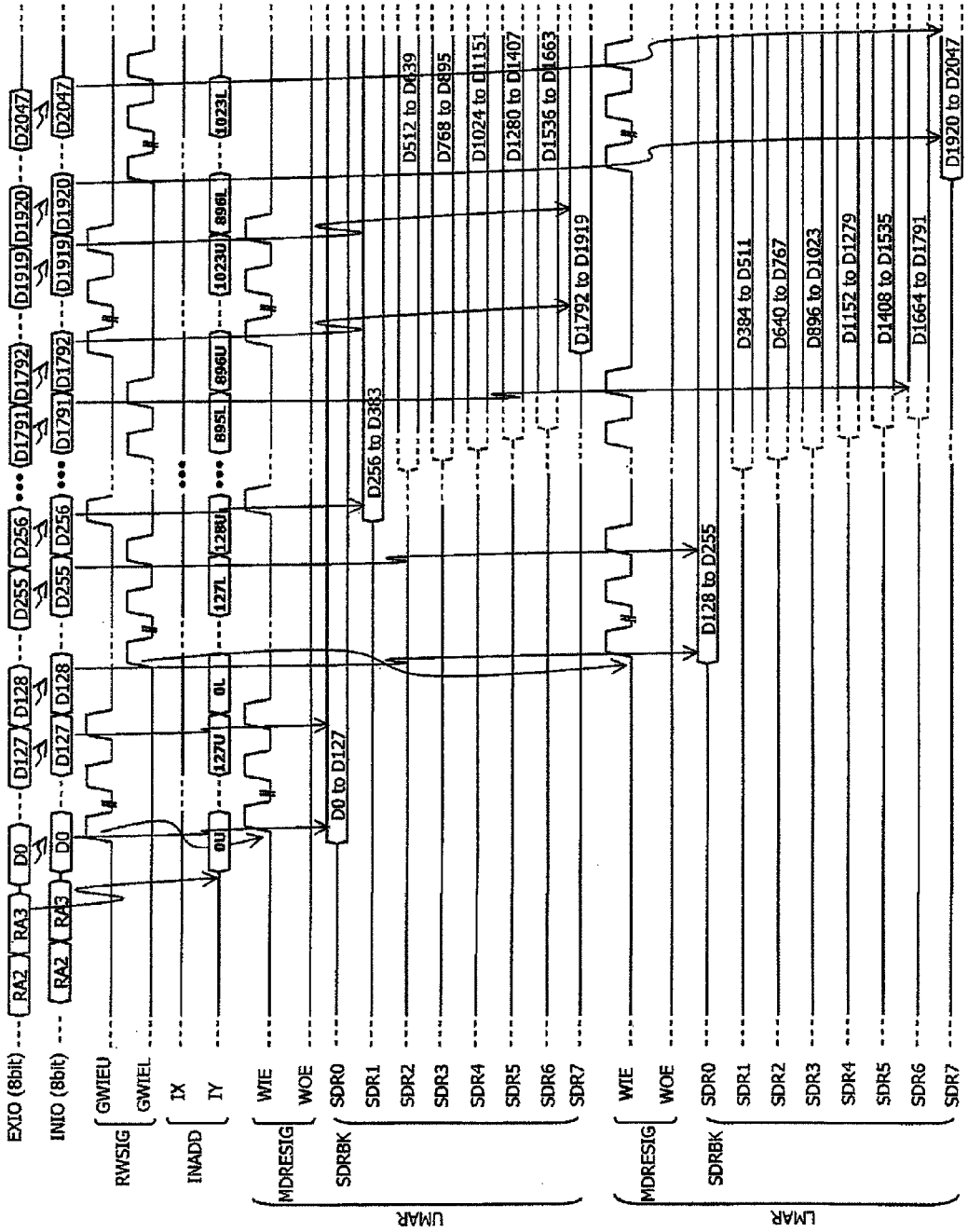
FIG. 7 is a diagram showing an example of a receiving operational sequence of storage information in the rewrite operation shown in FIG. 6.

The 2-kilobyte storage information D0 to D2047 inputted from the external input/output line EXIO to the internal input/output line INIO is loaded into the storage information register group SDRBK inside the memory areas UMAR and LMAR in a procedure as shown in FIG. 7. A feature of an operational sequence shown in FIG. 7 is that the 2-kilobyte storage information D0 to D2047 is divided into pieces of data by a unit of 128 bytes and is transferred alternately to the memory areas UMAR and LMAR. Here, in a viewpoint that all of the data of 1024 bytes can be stored, it is desired that 1024 bytes which are half of the data of 2 kilobytes are transferred to the storage information register SDRBK of the memory area UMAR shown in FIG. 4, and the register is formed of eight small-scale storage information register groups SDR0 to SDRy (y=7) with taking 128 bytes as one unit. Also, it is assumed that each of the small-scale storage information register groups SDR0 to SDR7 is formed of 128 z-byte registers ZBR0 to ZBRx (x=127).

In the drawing, as components of the read/write control signal RWSIG, global storage information register start signals GWIEU and GWIEL are shown. One start signal GWIEU is inputted to the memory area control circuit MARCTL inside the upper memory area UMAR and is used to temporarily store the storage information inputted from the internal input/output line INIO in the storage information register group SDRBK inside the upper memory area UMAR. The other start signal GWIEL is inputted to the memory area control circuit MARCTL inside the lower memory area LMAR and is used to temporarily store the storage information inputted from the internal input/output line INIO in the storage information register group SDRBK inside the lower memory area LMAR. Also, as components of the internal address INADD, an internal row address IX and an internal column address IY are shown.

Further, in the drawing, as components of the storage information register start signal group MDRESIG in the memory areas UMAR and LMAR, a storage information input start signal WIE and a storage information output start signal WOE are shown. The former storage information input start signal WIE is used to temporarily store the storage information transferred from the internal input/output line INIO in the storage information register group SDRBK inside the memory area. The latter storage information output start signal WOE is used to selectively transmit the information which is temporarily stored in the storage information register group SDRBK to the sense latch/rewrite driving circuit group SWBK via the data line group MDL. Hereinafter, details of the operation are described.

First, after completion of the input of the start address signals (RA2 and RA3 in the drawing), each of internal column addresses IY0U to IY127U for loading the storage information of first 128 bytes and a global storage information register start signal GWIEU of 128 cycles is generated. Then, in the upper memory area UMAR, the storage information input start signal WIE in synchronization with the global storage information register start signal GWIEU is generated. In synchronization with these internal column addresses IY0U to IY127U and storage information input start signal WIE, the storage information D0 to D127 are sequentially inputted to the z-byte registers ZBR0 to ZBR127 of the small-scale storage information register group SDR0 in the storage information register group SDBK inside the upper memory area UMAR.

Next, each of internal column addresses IY0L to IY127L for loading the storage information D128 to D255 and a global storage information register start signal GWIEL of 128 cycles is generated. Then, in the lower memory area LMAR, the storage information input start signal WIE in synchronization with the global storage information register start signal GWIEL is generated. In synchronization with these internal column addresses IY0L to IY127L and storage information input start signal WIE, the storage information D128 to D255 are sequentially inputted to the z-byte registers ZBR0 to ZBR127 of the small-scale storage information register group SDR0 in the storage information register group SDBK inside the lower memory area LMAR.

Subsequently, each of internal column addresses IY128U to IY255U for loading the storage information D256 to D383 and a global storage information register start signal GWIEU of 128 cycles is generated. Then, in the upper memory area UMAR, the storage information input start signal WIE in synchronization with the global storage information register start signal GWIEU is generated. In synchronization with these internal column addresses IY128U to IY255U and storage information input start signal WIE, the storage information D256 to D383 are sequentially inputted to the z-byte registers ZBR0 to ZBR127 of the small-scale storage information register group SDR1 in the storage information register group SDBK inside the upper memory area UMAR. In the following, the storage information is similarly transferred, so that the storage information D1792 to D1919 are inputted to the small-scale storage information register group SDR7 in the storage information register SDRBK in the memory area UMAR, and the storage information D1920 to D2047 are inputted to the small-scale storage information register group SDR7 in the storage information register SDRBK in the memory area LMAR. With that, the transfer of the storage information ends. At this time, apart of the data can be transferred to the sense latch prior to the storage of all of the data received in accordance with the page size in the rewrite driving circuit group SWBK. Also, by dividing 128 bytes into several pieces of data when the data transferred to the sense latch is written in the memory tile and writing the pieces of data as shifting timings, increase in total current flowing through word drivers can be prevented.

<<2-Kilobyte Rewrite Operation to Memory Plane>>

Figure 8:
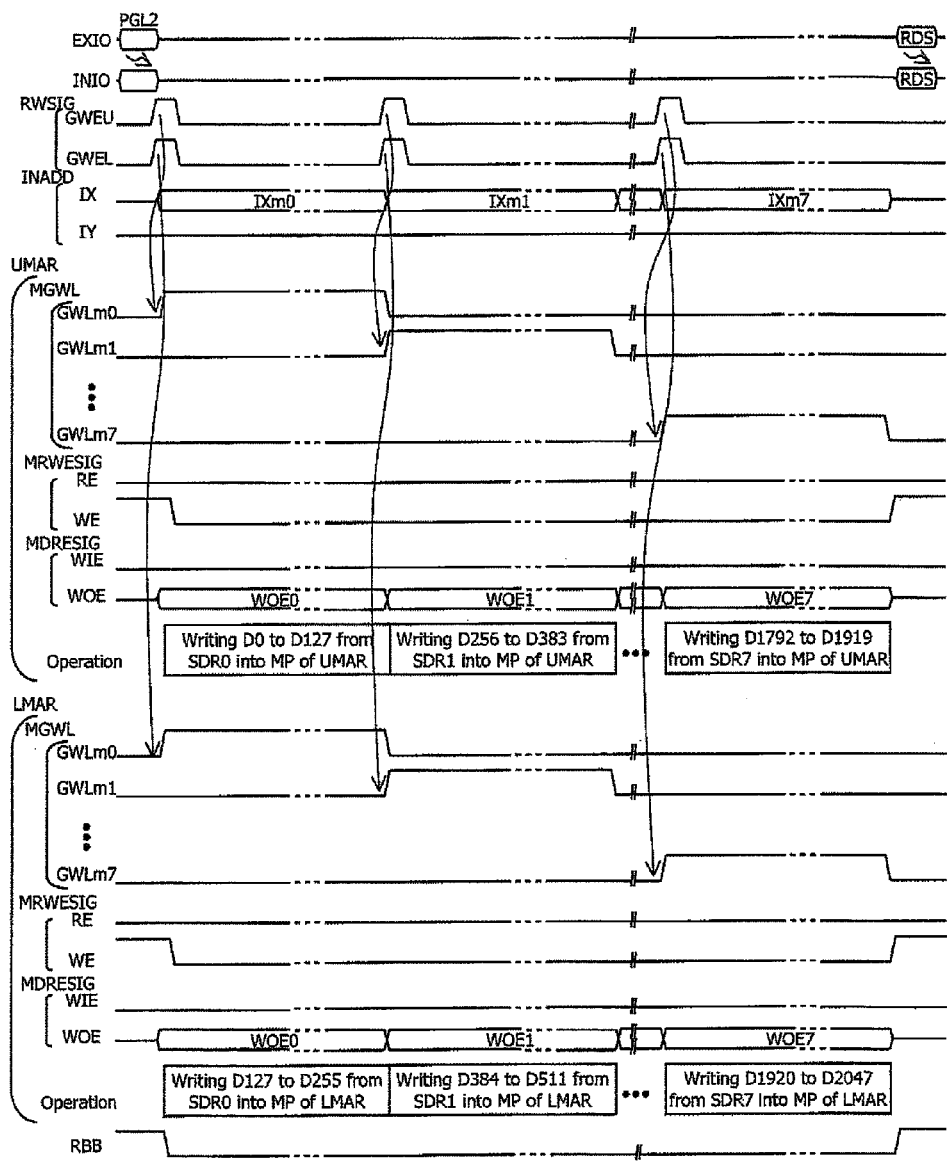
FIG. 8 is a diagram showing an example of a rewrite operational sequence to a memory plane in the rewrite operation shown in FIG. 6.

As the storage information inputted to the storage information register SDRBK of each of the memory areas UMAR and LMAR, pieces of the data divided into 128 bytes are parallely transferred to two upper and lower memory planes MPs by sequentially selecting the global word lines as shown in FIG. 8, and the data of 256 bytes is written therein by combining the two memory planes MPs. In the drawing, as components of the read/write control signal RWSIG, global rewrite start signals GWEU and GWEL are shown. One start signal GWEU is inputted to the memory area control circuit MARCTL inside the upper memory area UMAR. The other start signal GWIEL is inputted to the memory area control circuit MARCTL inside the lower memory area LMAR. Also, in addition to the storage information register start signal group MDRESIG in the memory areas UMAR and LMAR, a read start signal RE and a rewrite start signal WE which are components of the read/write start signal group MRWESIG are shown. The former read start signal RE is used to start each sense latch inside the sense latch/rewrite driving circuit group SWBK. The latter rewrite start signal WE is used to start each rewrite driving circuit in that circuit group.

First, after end of the load of the storage information into the storage information register group SDRBK in each of the memory areas UMAR and LMAR followed by input of the second command signal PGL2, each of the global rewrite start signals GWEU and GWEL of eight cycles, eight internal row addresses IXm0 to IXm7, and storage information output start signals WOE0 to WOE7 is sequentially generated. Also, during the above-described period, the rewrite start signal WE is activated at the low level.

Meanwhile, when the first internal row address IXm0 is issued, the memory area control circuit MARCTL inside each of the memory areas UMAR and LMAR selects a global word line GWLm0 in accordance with the internal row address IXm0. Then, the word driver WD0 in each of the memory tiles MTm0 to MTmn (n=127) crossing the global word line GWLm0 in each of the small-scale memory planes SMP0 to SMPx (x=127) is activated. Also, the memory area control circuit MARCTL controls a bit-line selection circuit MUX in accordance with the start address generated in the start address register AREG in order to control the bit line inside each memory tile. As a result, the storage information D0 to D127 are written in a memory cell (for example, MC00) on the word line WLm0 inside the memory area UMAR. Similarly, the storage information D128 to D255 are written in a memory cell (for example, MC00) on the word line WLm0 inside the memory area LMAR.

Next, when the second internal row address IXm1 is issued, the memory area control circuit MARCTL inside each of the memory areas UMAR and LMAR selects a global word line GWLm1 in accordance with the internal row address IXm1. Then, the word driver WD1 in each of the memory tiles MTm0 to MTmn (n=127) crossing the global word line GWLm1 in each of the small-scale memory planes SMP0 to SMPx (x=127) is activated. As a result, the storage information D256 to D383 are written in a memory cell (for example, MC10) on the word line WLm1 inside the memory area UMAR. Similarly, the storage information D384 to D512 are written in a memory cell (for example, MC10) on the word line WLm1 inside the memory area LMAR. In the following, the write operation is similarly continued. Finally, the global word line GWLm7 inside each of the memory areas UMAR and LMAR is selected in accordance with the eighth internal row address IXm7, so that the storage information D1792 to D1919 are written in the memory area UMAR, and the storage information D1920 to D2047 are written in the memory area LMAR. With that, the writing of the storage information ends. As described above, in the 2-kilobyte rewrite mode, the 2-kilobyte data is divided into sixteen pieces of data by 128 bytes, and the rewrite operation is performed eight times for each of the UMDR and the LMDR. Therefore, the internal address for the memory plane MP is generated eight times. Also, eight (sixteen for both) small-scale register groups are prepared for every 128 bytes.

As another method, note that there is a method of not using the data structure in which the storage information D0 to D2047 correspond to the internal column addresses IY one by one. In the method, a counter which counts the number of pieces of data inputted to the small-scale storage information register groups SDR0 to SDR7 is used to determine the number of pieces of transferred data, and, when the number of pieces of data is a predetermined value, the input data is switched to the next small-scale storage information register group SDR(y+1). With using this method, it is not required that the storage information except for the start-part data corresponds to the internal column addresses IY one by one, and therefore, the data to be transmitted to the address data small-scale storage information register group can be decreased. These two methods can be applied to not only the 2-kilobyte write operation but also a read operation and an operation in a changed data length described later.

Also, it is described above that the word line is reselected every time when the temporarily-stored data is written from one of the small-scale storage information register groups SDR0 to SDR7 into the small-scale memory planes SMP0 to SMPx (x=127). However, the memory-cell selecting operation is not limited to this. If eight or more bit lines BL0 to BLk (k≥7) are arranged inside one memory tile, a memory selecting operation such as switching only one bit-line selection circuit MUX inside the memory tile is possible. In this case, all of the data of the eight small-scale storage information register groups SDR0 to SDRy are written in memory cells on the same word line.

<<Summary of 2-Kilobyte Read Operation>>

Figure 9:
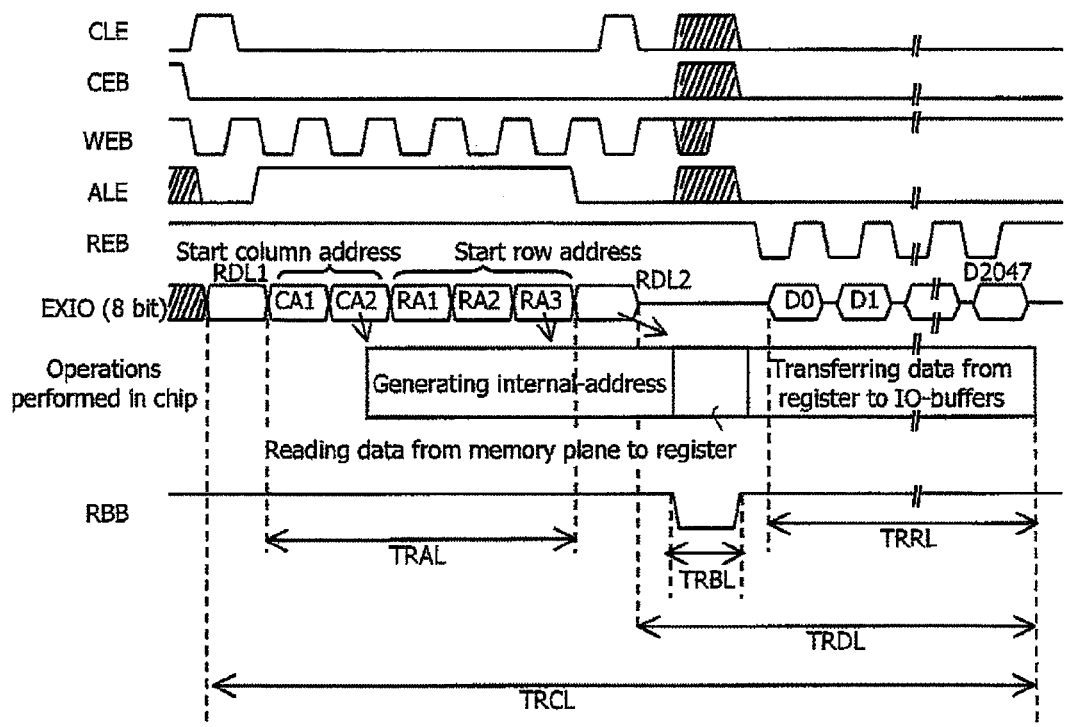
FIG. 9 is a diagram showing an example of a 2-kilobyte read operation of the phase-change memory shown in FIG. 1.

FIG. 9 shows an example of the read operation. The command latch start signal CLE which is at the low level is driven to the high level, and the chip start signal CEB and the address latch start signal ALE which are at the high level are driven to the low level. Then, when a first read command signal RDL1 is inputted via the external input/output line EXIO, the first read command signal RDL1 is loaded into the phase-change memory at a rising edge of the write start signal WEB. Next, the command latch start signal CLE which is at the high level is driven to the low level, and the address latch start signal ALE which is at the low level is driven to the high level, so that column addresses (CA1 and CA2) and row addresses (RA1, RA2, and RA3) are separately and sequentially inputted twice and three times, respectively. These addresses are loaded into the phase-change memory at the rising edge of the write start signal WEB, so that the addresses are sequentially decoded inside the chip. Further, the address latch start signal ALE which is at the high level is driven to the low level, and the command latch start signal CLE which is at the low level is driven to the high level, so that a second read command signal RDL2 is inputted to the external input/output line EXIO. This second read command signal RDL2 is loaded into the phase-change memory at the rising edge of the write start signal WEB, so that the read operation is performed in the memory areas UMAR and LMAR. Note that, in the read operation, the ready/busy signal RBB which is at the high level is driven to the low level. The storage information read from the memory array is transferred into the chip, the ready/busy signal RBB which is at the low level is driven to the high level, and then, every eight bits of the information are outputted in an order of D0 to D2047 in synchronization with the rising edge of the read start signal REB. Here, it is assumed that time taken from the start of the read operation until the end of the output of the storage information D2047 is indicated by a 2-kilobyte read operation time TRDL. Also, it is assumed that access cycle time TRCL indicates time containing address input time TRAL taken when the start column address and the start row address are inputted, busy time TRBL taken when the ready/busy signal RBB is driven to the low level, and time TRRL taken when the storage information is transferred from the small-scale storage information register group to the input/output buffer. Most of the 2-kilobyte read operation time TRDL is configured of the busy time TRBL and the data transfer time TRRL.

<<2-Kilobyte Read Operation from Memory Plane>>

Figure 10:
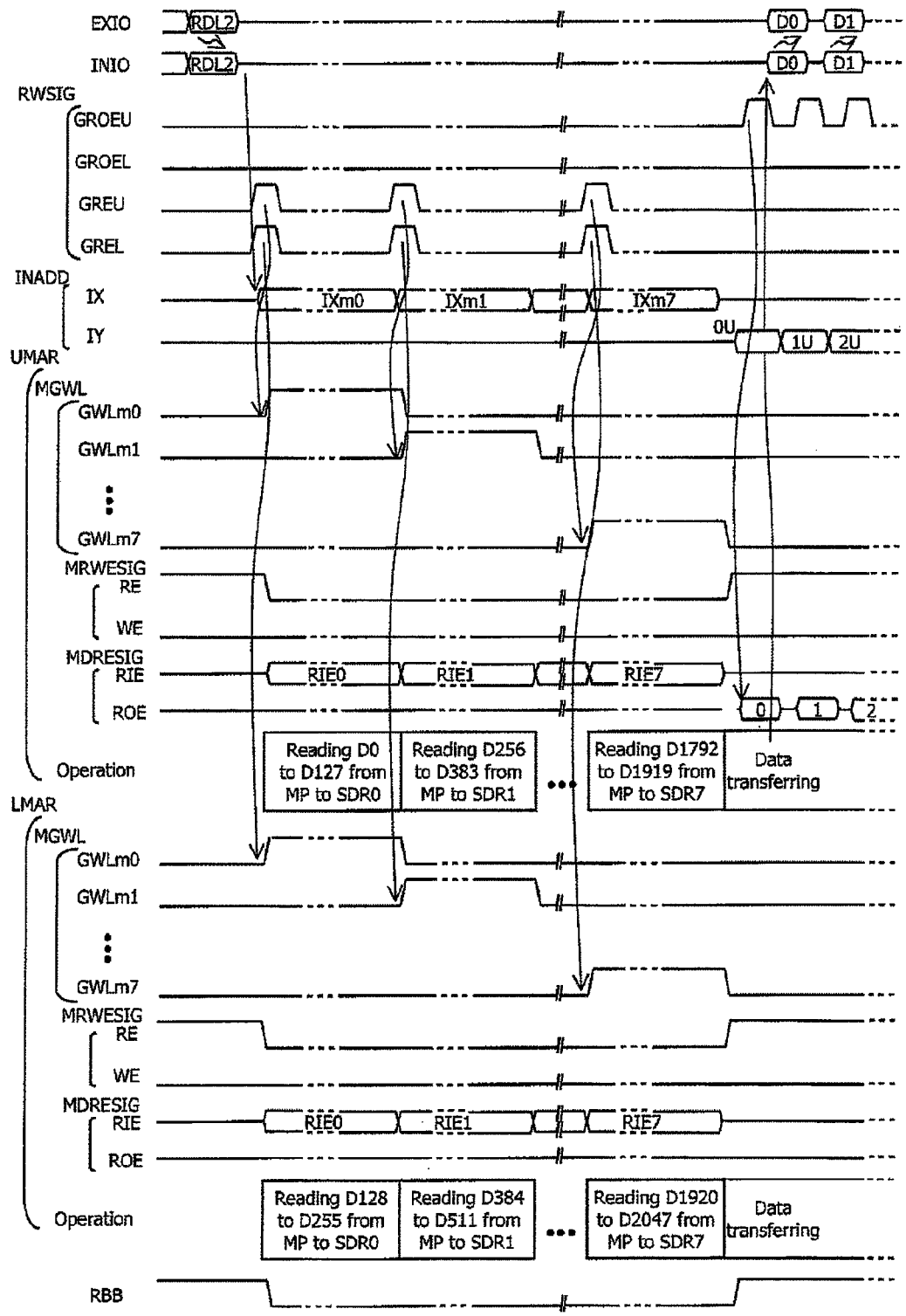
FIG. 10 is a diagram showing an example of a read operational sequence from the memory plane in the read operation shown in FIG. 9.

Reversely to the write operation described above, the storage information D0 to D2047 of 2 kilobytes outputted from the internal input/output line INIO (having a width of eight bits) to the external input/output line EXIO (having a width of eight bits) are read from the memory areas UMAR and LMAR by a procedure as shown in FIG. 10. That is, every 128 bytes of the storage information D0 to D2047 of 2 kilobytes are read from both of the memory areas UMAR and LMAR, and are temporarily stored in the storage information register group SDRBK. After the 2 kilobytes are read, these pieces of storage information are sequentially transferred to the external input/output line EXIO via the internal input/output line INIO.

In the drawing, as components of the read/write control signal RWSIG, global read start signals GREU and GREL and global storage information register start signals GROEU and GROEL which are other components of the read/write control signal RWSIG are shown. The start signal GREU is inputted to the memory area control circuit MARCTL inside the upper memory area UMAR. The start signal GREL is inputted to the memory area control circuit MARCTL inside the lower memory area LMAR. The start signal GROEU is inputted to the memory area control circuit MARCTL inside the upper memory area UMAR, and is used to output the information, which is temporarily stored in the storage information register group SDRBK inside the upper memory area UMAR, to the internal input/output line INIO. The start signal GROEL is inputted to the memory area control circuit MARCTL inside the lower memory area LMAR, and is used to output the information, which is temporarily stored in the storage information register group SDRBK inside the lower memory area LMAR, to the internal input/output line INIO.

Also, in addition to the read/write start signal group MRWESIG in each of the memory areas UMAR and LMAR, a storage information input start signal RIE and a storage information output start signal ROE which are other components of the storage information register start signal group MDRESIG are shown. The former storage information input start signal RIE is used to temporarily store the storage information, which is read to the sense latch in an operation described later, in the storage information register group SDRBK via the data line group MDL. The latter storage information output start signal ROE is used to selectively output the storage information, which is temporarily stored in the storage information register group SDRBK, to the internal input/output line INIO. Hereinafter, details of the operation are described.

First, after end of the reception of the start address followed by input of the second command signal PGL2, each of global read start signals GREU and GREL of eight cycles, eight internal row addresses IXm0 to IXm7, and storage information input start signals RIE0 to RIE7 is sequentially generated. Also, during the above-described period, the read start signal RE is activated at the low level.

Meanwhile, when the first internal row address IXm0 is issued, the memory area control circuit MARCTL in each of the memory areas UMAR and LMAR selects the global word line GWLm0 in accordance with the internal row address IXm0. Then, the word driver WD0 in each of the memory tiles MTm0 to MTmn (n=127) crossing the global word line GWLm0 in each of the small-scale memory planes SMP0 to SMPx (x=127) is activated. As a result, the storage information D0 to D127 are read from a memory cell (for example, MC00) on the word line WLm0 inside the memory area UMAR. Similarly, the storage information D128 to D255 are read from a memory cell (for example, MC00) on the word line WLm0 inside the memory area LMAR.

Next, when the second internal row address IXm1 is issued, the memory area control circuit MARCTL in each of the memory areas UMAR and LMAR selects the global word line GWLm1 in accordance with the internal row address IXm1. Then, the word driver WD1 in each of the memory tiles MTm0 to MTmn (n=127) crossing the global word line GWLm1 in each of the small-scale memory planes SMP0 to SMPx (x=127) is activated. As a result, the storage information D256 to D383 are read from a memory cell (for example, MC10) on the word line WLm1 inside the memory area UMAR. Similarly, the storage information D384 to D512 are read from a memory cell (for example, MC10) on the word line WLm0 inside the memory area LMAR.

In the following, the read operation is similarly continued. Finally, the global word line GWLm7 inside each of the memory areas UMAR and LMAR is selected in accordance with the eighth internal row address IXm7, so that the storage information D1792 to D1919 are read from the memory area UMAR, and the storage information D1920 to D2047 are read from the memory area LMAR.

Then, each of internal column addresses IY0U to IY127U for outputting the storage information of first 128 bites and the global storage information register start signal GROEU of 128 cycles is generated. Then, in the upper memory area UMAR, the storage information output start signal ROE in synchronization with the global storage information register start signal GROEU is generated. In synchronization with these internal column addresses IY0U to IY127U and the storage information output start signal ROE, the storage information D0 to D127 are sequentially outputted from the z-byte registers ZBR0 to ZBR127 of the small-scale storage information register group SDR0 in the storage information register group SDBK inside the upper memory area UMAR.

Although omitted in the drawing, each of internal column addresses IY0L to IY127L for outputting the storage information D128 to D255 and the global storage information register start signal GROEL of 128 cycles is similarly generated. Then, in the lower memory area LMAR, the storage information output start signal ROE in synchronization with the global storage information register start signal GROEL is generated. In synchronization with these internal column addresses IY0L to IY127L and the storage information output start signal ROE, the storage information D128 to D255 are sequentially outputted from the z-byte registers ZBR0 to ZBR127 of the small-scale storage information register group SDR0 in the storage information register group SDBK inside the lower memory area LMAR. In the following, similarly, every 128 bytes of the storage information are sequentially transferred alternately from the memory areas UMAR and LMAR via the internal input/output line INIO to the external input/output line EXIO, so that the reading of the storage information is completed.

<<512-Byte Rewrite Operation>>

Figure 11:
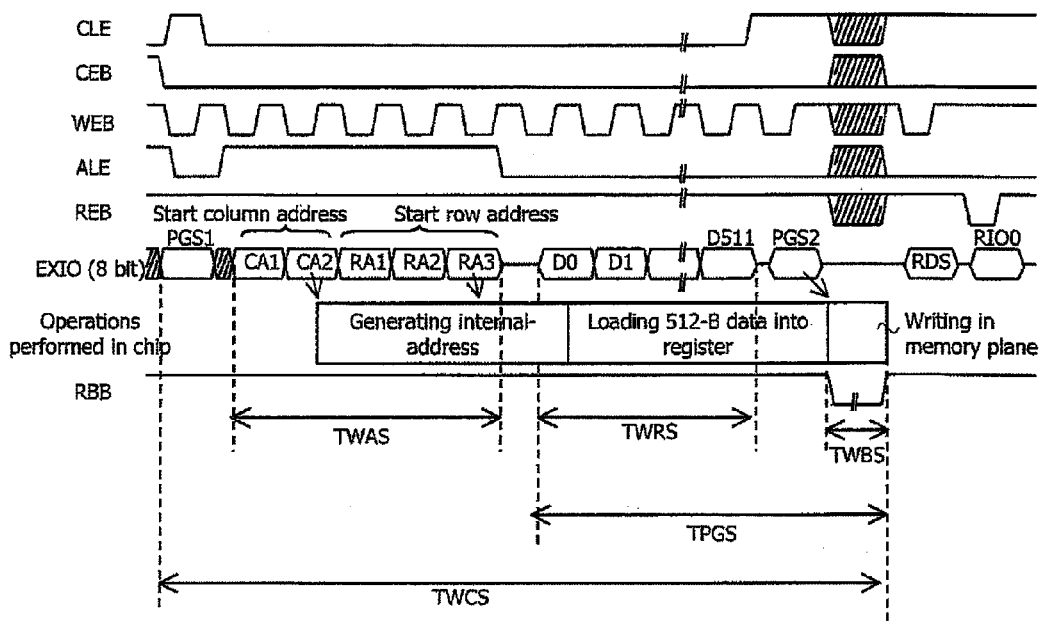
FIG. 11 is a diagram showing an example of a 512-byte rewrite operation of the phase-change memory shown in FIG. 1.
Figure 12:
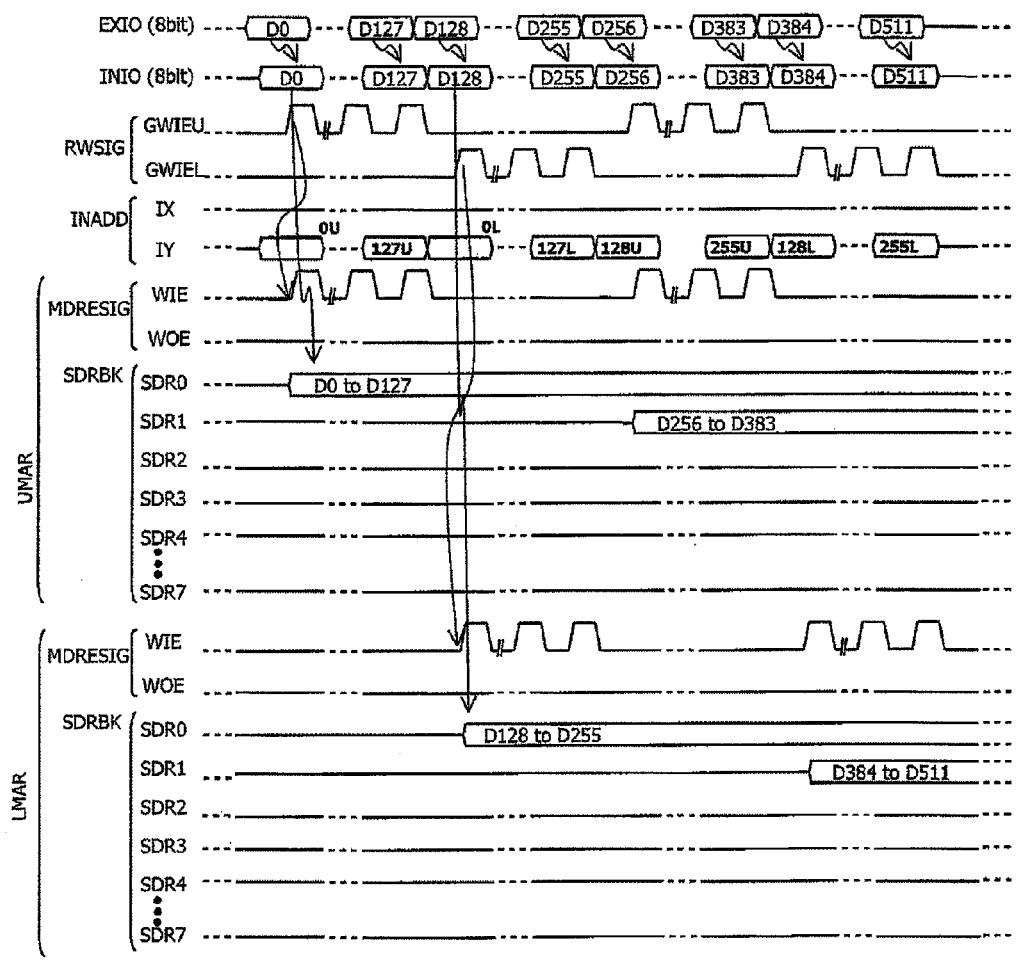
FIG. 12 is a diagram showing an example of a receive operational sequence of storage information in the rewrite operation shown in FIG. 11.

FIG. 11 shows an example of a 512-byte rewrite operation. A different point from the 2-kilobyte rewrite operation shown in FIG. 9 is that the paired commands are changed from PGL1 and PGL2 to PGS1 and PGS2. By input of the paired commands PGS1 and PGS2, the storage information D0 to D511 of 512 bytes inputted from the external input/output line EXIO (having a width of eight bits) to the internal input/output line INIO (having a width of eight bits) are divided into pieces of data by a unit of 128 bytes, and are transferred alternately to the memory areas UMAR and LMAR. For example, as shown in FIG. 12, these pieces of storage information are sequentially and temporarily stored in the small-scale storage information register groups SDR0 and SDR1 inside the storage information register SDRBK. As shown in the drawing, a destination of the storage information is determined by the internal column addresses IY0U to IY255U and IY0L to IY255L.

Figure 13:
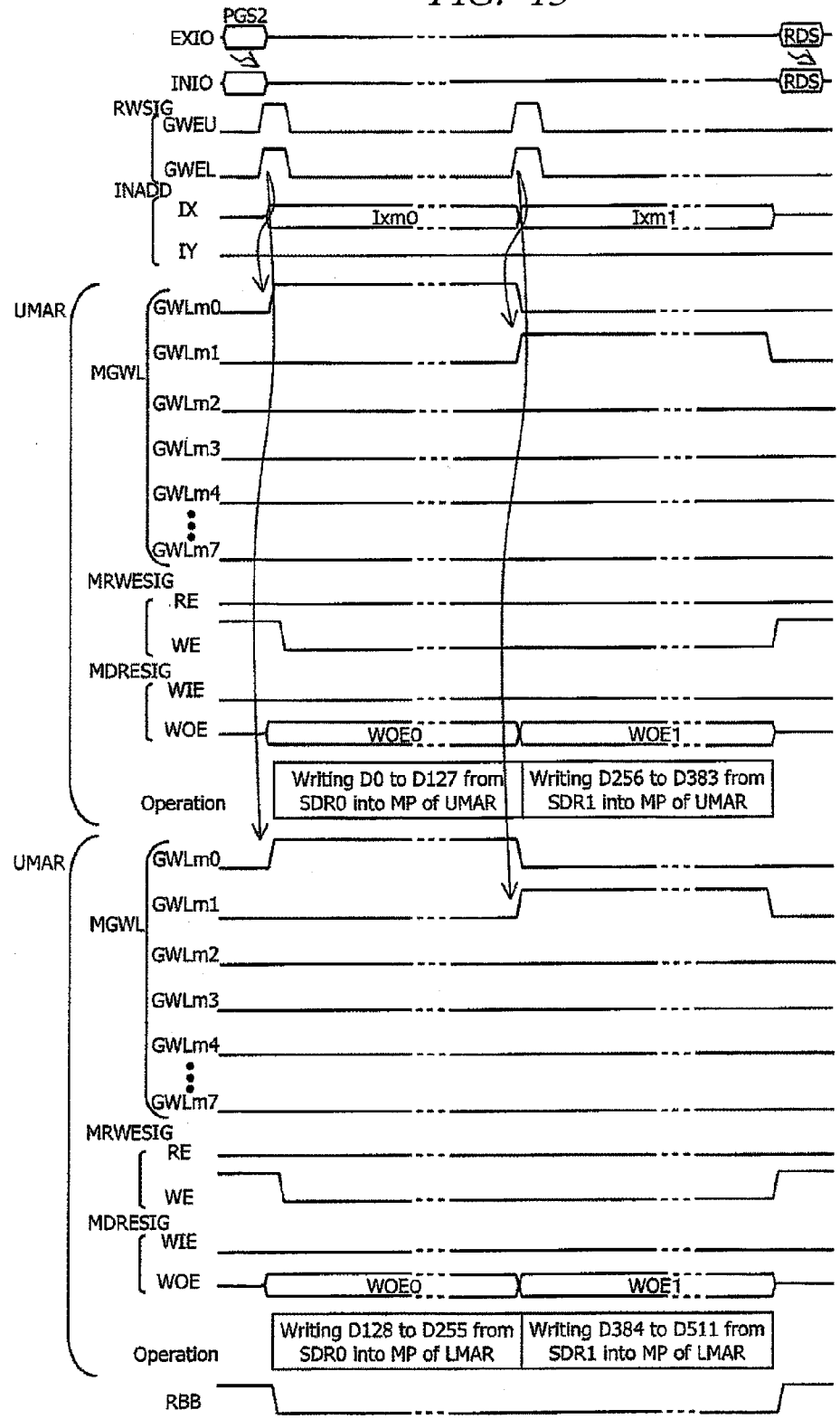
FIG. 13 is a diagram showing an example of a rewrite operational sequence to the memory plane in the rewrite operation shown in FIG. 11.

By sequentially selecting two global word lines as shown in FIG. 13, every 256 bytes of the storage information inputted to the storage information register SDRBK of each of the memory areas UMAR and LMAR are written into the memory plane MP. The drawing shows an example that the rewrite operation is performed by using global rewrite start signals GWEU and GWEL of two cycles, two internal row addresses IXm0 and IXm1, and storage information output start signals WOE0 and WOE1. In this case, by selecting the global word lines GWLm0 and GWLm1 in accordance with the first internal row address IXM0 and the second internal row address IXm1, the storage information D0 to D511 are written in memory cells (for example, MC00 and MC10) on the word lines WL0 and WL1 in accordance with the global word lines GWLm0 and GWLm1. As described above, in the 512-byte rewrite mode, the data of 512 bytes is divided into four pieces of data by 128 bytes, and the rewrite operation is performed twice for each of the UMDR and the LMDR. Therefore, the internal address for the memory plane MP is generated twice. Also, two (four for both) small-scale register groups are prepared for every 128 bytes. That is, as compared to the 2-kilobyte mode, by setting the write unit performed once as same as that but setting the less number of times of generation of the internal address than that, the rewriting of the less volume of data is achieved. Further, as the small-scale storage information register group, by using a part of the register groups which are used in the 2-kilobyte rewrite mode, the circuit area can be reduced. Note that, in FIG. 11, it is assumed that time taken from the input start of the storage information D0 until the end of the rewrite operation is indicated by a 512-byte rewrite operation time TPGS. Also, it is assumed that access cycle time TWCS indicates time containing address input time TWAS taken when the start column address and the start row address are inputted, busy time TWBS taken when the ready/busy signal RBB is driven at the low level, and data storage time TWRS taken when the storage information is stored in the small-scale storage information register group. Most of the 512-byte rewrite operation time TPGS is configured of the data storage time TWRS and the busy time TWBS. Here, when the access cycle time TWCS in the 512-byte mode and the access cycle time TWCL in the 2-kilobyte mode shown in FIG. 6 are compared with each other, the address input times TWAL and TWAS are equal to each other. However, the data storage time TWRS, the busy time TWBS, and the rewrite operation time TPGS in the 512-byte mode are shorter than the data storage time TWRL, the busy time TWBL, and the rewrite operation time TPGL in the 2-kilobyte mode, respectively. This is because the inputted and outputted data is less in the 512-byte mode. Therefore, the access cycle time TWCS in the 512-byte mode can be shorter than the access cycle time TWCL in the 2-kilobyte mode.

Note that, similarly to the 2-kilobyte write operation, apart of the data can be transferred to the sense latch prior to the storage of all of the data, which is received in accordance with the page size, in the rewrite driving circuit group SWBK. Also, by dividing 128 bytes into several pieces of data when the data transferred to the sense latch is written in the memory tile and writing the pieces of data as shifting timings, increase in total current flowing through respective sub-word drivers can be prevented.

<<512-Byte Read Operation>>

Figure 14:
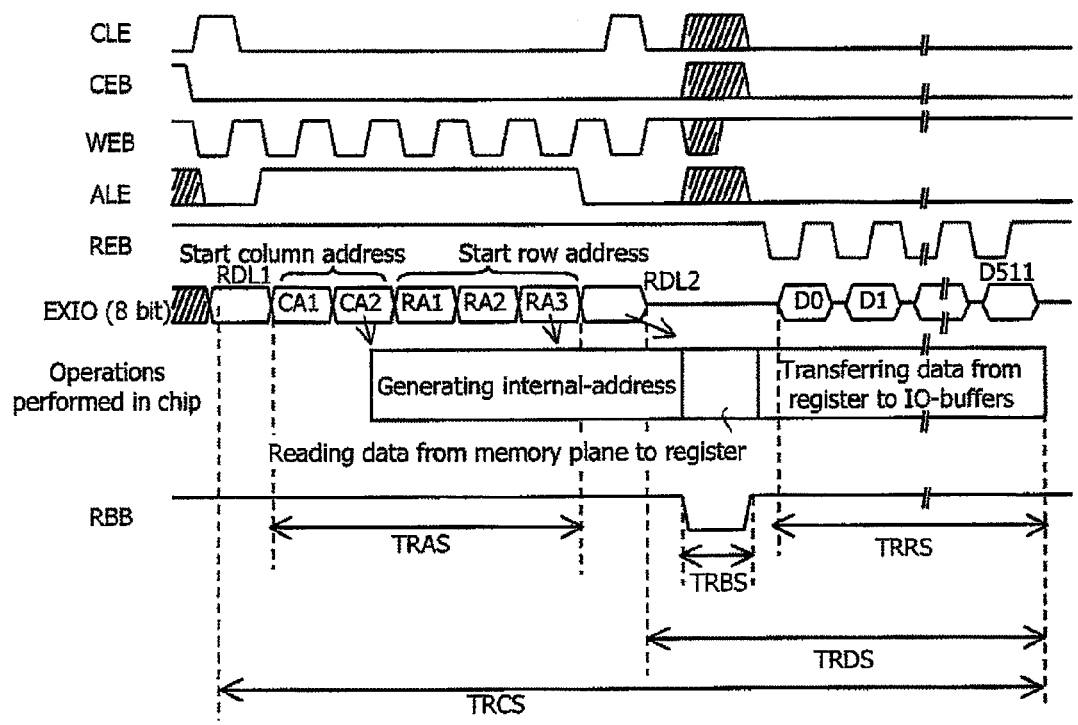
FIG. 14 is a diagram showing an example of a 512-byte read operation of the phase-change memory shown in FIG. 1.

FIG. 14 shows an example of the read operation. A different point from the 2-kilobyte read operation shown in FIG. 6 is that the paired commands are changed from RDL1 and RDL2 to RDS1 and RDS2. By input of the paired commands RDS1 and RDS2, the storage information D0 to D511 of 512 bytes are read from the memory areas UMAR and LMAR.

Figure 15:
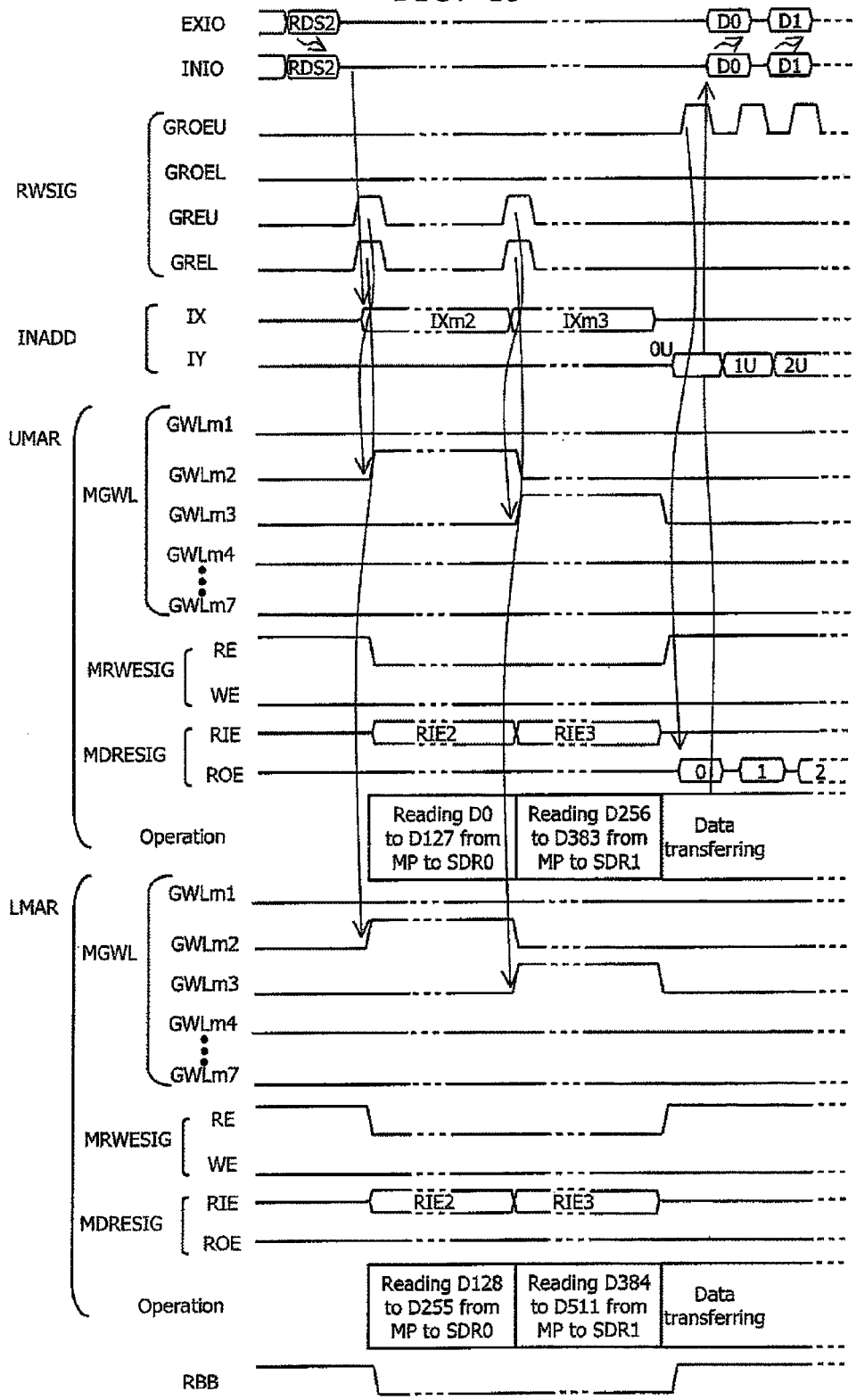
FIG. 15 is a diagram showing an example of a read operational sequence from the memory plane in the read operation shown in FIG. 14.

In the memory areas UMAR and LMAR, by sequentially selecting two global word lines as shown in FIG. 15, the storage information of 128 bytes is divided to be separately read twice from the memory plane MP to two small-scale storage information register groups inside the storage information register group SDRBK. For example, as shown in the drawing, each of global read start signals GREU and GREL of two cycles, two internal row addresses IXm2 and IXm3, and storage information input start signals RIE2 and RIE3 is sequentially generated. In this case, by selecting the global word lines GWLm2 and GWLm3 in accordance with the first internal row address IXm2 and the second internal row address IXm3, the storage information D0 to D511 are read from memory cells (for example, MC20 and MC30) on the word lines WL2 and WL3 in accordance with the global word lines GWLm2 and GWLm3 to the small-scale storage information register groups SDR0 and SDR1. And, every 128 bytes of these pieces of storage information are transferred alternately from the memory areas UMAR and LMAR to the external input/output line EXIO (having a width of 8 bits). Note that, in FIG. 14, time taken from the start of the read operation until the end of the output of the storage information D511 is indicated by a 512-byte read operation time TRDS. Also, access cycle time TRCS indicates time containing address input time TRAS taken when the start column address and the start row address are inputted, busy time TRBS taken when the ready/busy signal RBB is driven at the low level, and time TRRS taken when the storage information is transferred from the small-scale storage information register group to the input/output buffer. Most of the 512-byte read operation time TRDS is configured of the busy time TRBS and the data transfer time TRRS. The address input time TRAS in the 512-byte mode is equal to the address input time TRAL in the 2-kilobyte mode shown in FIG. 9. However, the busy time TRBS and the time TRRS taken when the storage information is transferred in the 512-byte mode can be shorter than the busy time TRBL and the time TRRL taken when the storage information is transferred in the 2-kilobyte mode by the above-described structure and operation, respectively. Therefore, the access cycle time TRCS in the 512-byte mode can be shorter than the access cycle time TRCL in the 2-kilobyte mode.

By the above-described structure and operation, the following two effects can be obtained. As a first effect, a desired process can be performed within an access period during when the input/output storage information for once is read/written by using a plurality of commands in accordance with the storage information volume as shown in FIG. 2, setting modes each having different written data volume to the page size register, and controlling the storage information volume to be written in the memory plane MP in accordance with the mode set in the corresponding page size register. As a second effect, the transfer time for, particularly, the small-volume storage information (of 512 bytes in the example of the present embodiment) can be reduced, so that the read/write operation time can be reduced, by temporarily storing the storage information alternately in the storage information register groups SDRBK arranged in both of the memory areas as shown in FIGS. 7, 10, 12, and 15 in addition to performing the read/write operation simultaneously to both of the memory areas shown in FIG. 1 as shown in FIGS. 8, 10, 13, and 15. That is, here, the 512-byte rewrite operation time TPGS (FIG. 11) can be shorter than the 2-kilobyte rewrite operation time TPSL (FIG. 6), and the 512-byte read operation time TRDS (FIG. 14) can be shorter than the 2-kilobyte read operation time TRDL (FIG. 9).

Note that the access cycle time is descried above as the time containing the address input time TWAL, the data storage time TWRL, and the busy time TWBL. However, the access cycle time in the present application is not limited to this. For example, the access cycle time can be also described as time during from input of a command (for example, PGL2 or RDS2) indicating the writing or the reading of the storage information to or from the memory plane to input of a command (for example, RDS) indicating a next operation. In any definition, depending on the selected mode, the time of writing in the memory plane or reading from the memory plane can be shortened.

Second Embodiment

The present embodiment describes architecture used for a case that, in a semiconductor storage device to which the conventional NAND-type flash memory is applied, the NAND-type flash memory is replaced by a memory such as a phase-change memory not requiring a block erase operation. A feature of the present architecture is that a response to a block erase command to be received in an application processed by a conventional firmware is achieved. Hereinafter, the description is made with reference to FIGS. 1, 2, and 16.

Figure 16:
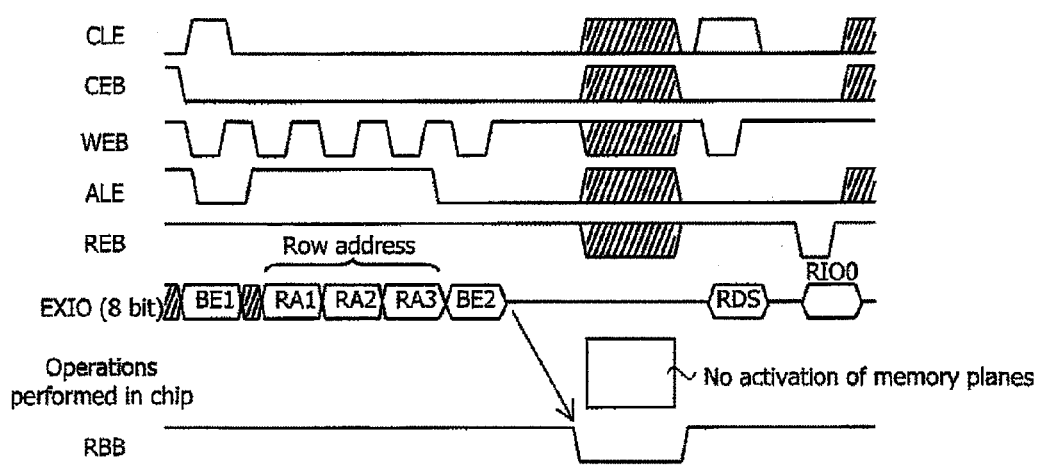
FIG. 16 is a diagram showing an example of a block erase operation of a phase-change memory in a semiconductor device of a second embodiment of the present invention.

A feature of the present architecture in a viewpoint of a structure is that a block erase register is provided inside the command register/control logic circuit CRCL as shown in FIG. 1. In the present register, information indicating reception of block erase commands BE1 and BE2 as shown in FIG. 2 is temporarily stored. These commands are inputted in an order of a first block erase command BE1, row addresses RA1 to RA3, and a second block erase command BE2 as shown in FIG. 16. After the block erase commands BE1 and BE2 are received, a ready/busy signal RBB is transmitted during only a certain period. During this, no read/write operation is performed in the memory plane MP. It is desired that this certain period is shorter than the time taken when the ready/busy signal is transmitted in the 2-kilobyte rewrite mode and the 512-byte rewrite mode.

By the above-described structure and operation, a central processing unit (CPU) controlling the semiconductor storage device recognizes that the block erase operation in the phase-change memory has been immediately completed, and can execute a subsequent task. Therefore, a manufacturer of the semiconductor storage device can achieve a system to which the memory such as the phase-change memory not requiring the block erase operation is applied, by using the firmware used for the semiconductor storage device to which the conventional NAND-type flash memory is applied. For a user of the present semiconductor storage device, information processing time can be reduced by the block erase operation time required in the NAND-type flash memory.

Third Embodiment

Figure 17:
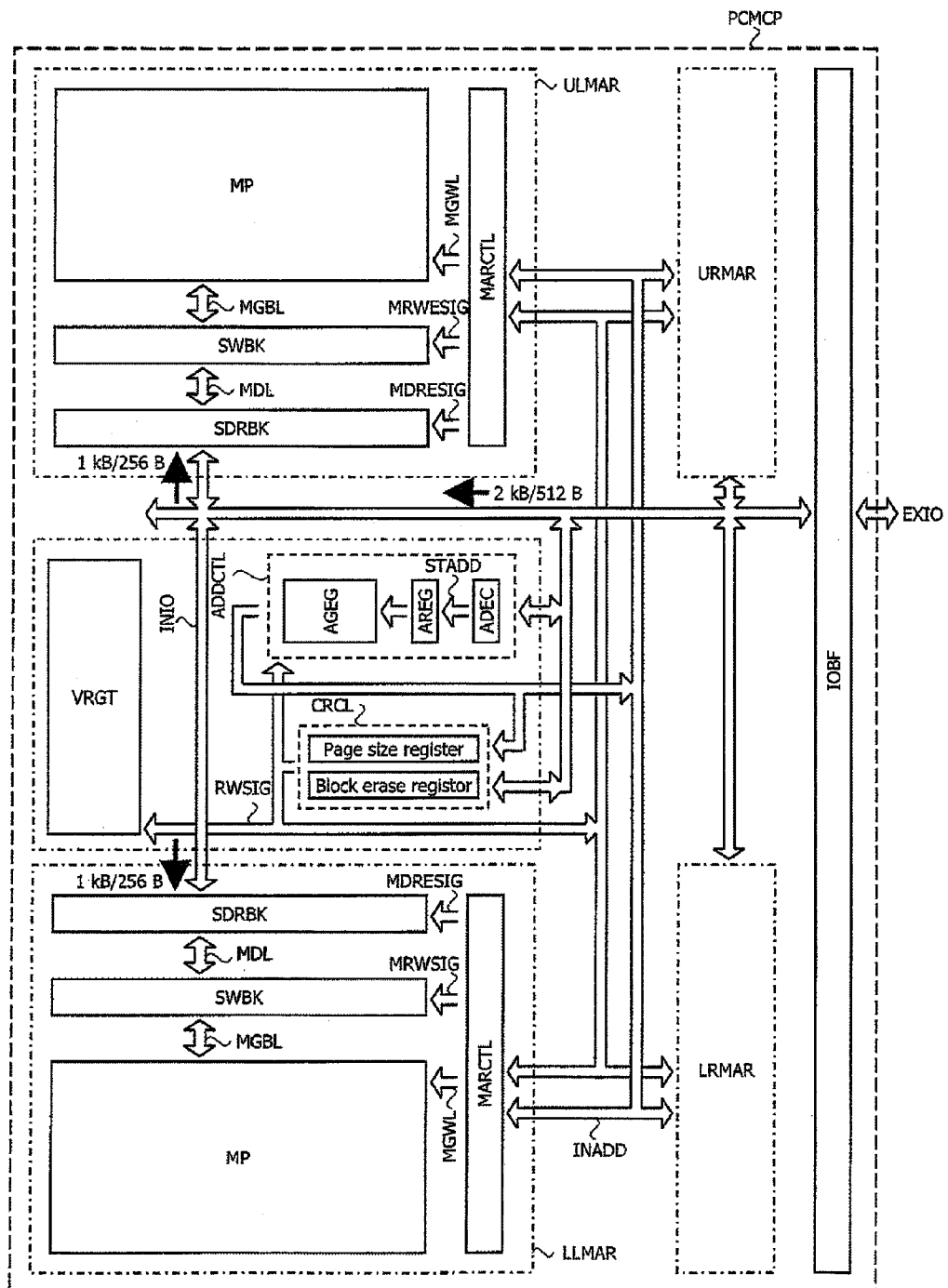
FIG. 17 is a diagram showing an example of a structure of principal-part circuit blocks of a phase-change memory in a semiconductor device of a third embodiment of the present invention.

The present embodiment describes a chip structure and an operation in a case that the capacity of the phase-change memory is larger. A feature of the present chip structure is that four memory areas ULMAR, URMAR, LLMAR, and LRMAR are provided as shown in FIG. 17. A feature of the present chip operation is that two memory areas (the memory areas ULMAR and LLMAR in the example of the drawing) of the four memory areas are activated to perform the read/write operation.

The four memory areas ULMAR, URMAR, LLMAR, and LRMAR have the same circuit block structure as that of the memory areas UMAR and LMAR shown in FIG. 1. Also, the operation of the activated memory-area pair is the same as those described in the first and second embodiments. In the large-capacity phase-change memory, a length of the global bit line can be suppressed by such a structure. That is, by suppressing a wiring resistance and a wiring capacity in the global bit line, the time required for the read/write operation and the operating voltage can be suppressed.

Fourth Embodiment

The present embodiment describes another example of the rewrite operation in the memory areas described in the first embodiment. A feature of the sequence of the present operation is to perform a verify read operation so that the number of bytes to be simultaneously read is larger than the number of bytes to be simultaneously rewritten. The number of times of the verify read operation depends on characteristic variation of the memory cells and a re-rewrite operation strategy. Hereinafter, the operation according to the present embodiment is described as assuming that the verify read operation is performed ten times.

Figure 18:
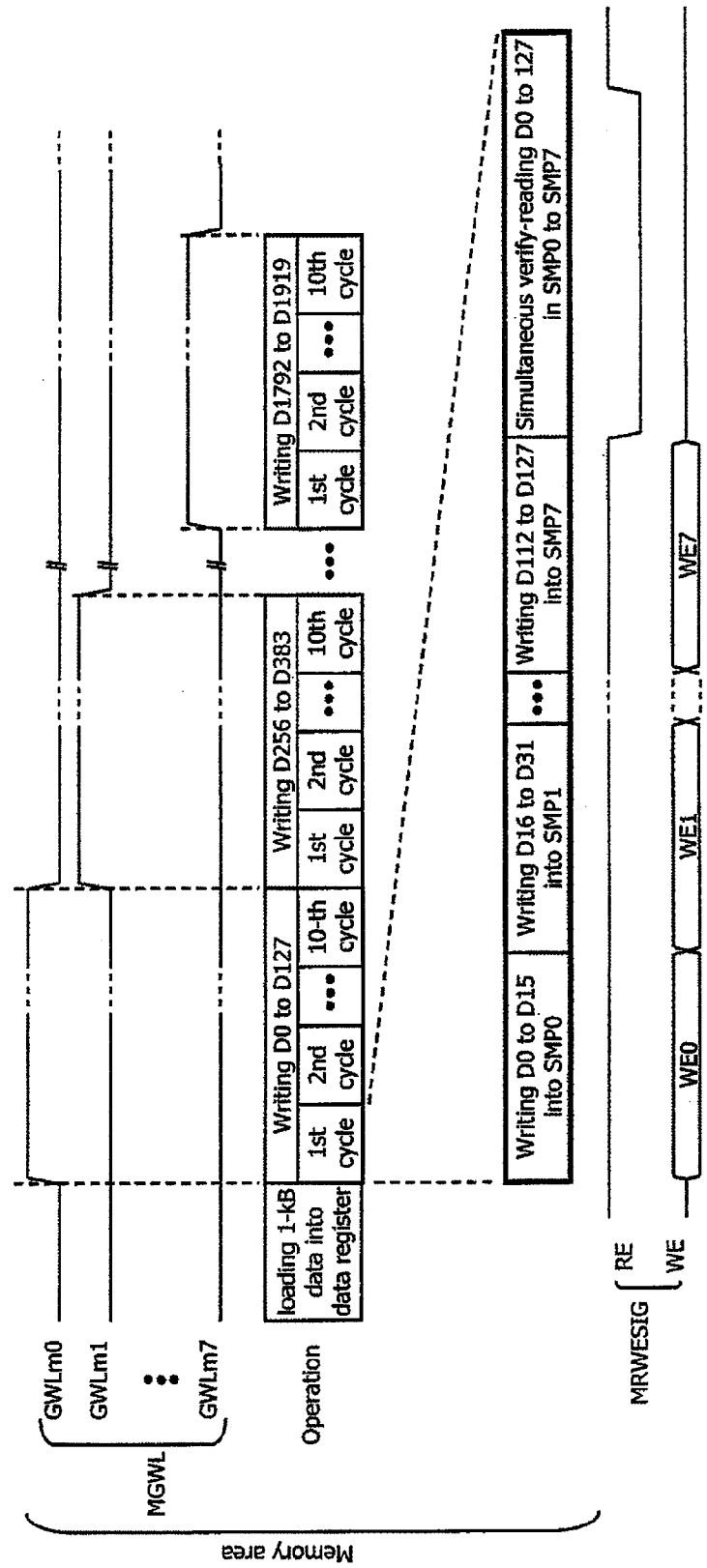
FIG. 18 is a diagram showing an example of a rewrite operational sequence in a case of application of a verify read operation in a phase-change memory in a semiconductor device of a fourth embodiment of the present invention.

FIG. 18 shows an operational sequence in one memory area of the phase-change memory shown in FIG. 1. In focusing on a first cycle in the rewrite operation of the storage information D0 to D127 of 128 bytes, the rewrite operation is selectively performed in every 16 bytes. Such a selecting operation is performed in accordance with the rewrite start signals WE0 to WE7. These rewrite start signals WE0 to WE7 are components of the read/write control signal RWSIG, and are provided so as to correspond to the small-scale sense latch/rewrite driving circuit groups SWM0 to SWMx (x=127) in the sense latch/rewrite driving circuit group SWBK in FIG. 5. After the rewrite operation of the storage information D0 to D127, these 128 bytes are simultaneously read, and it is determined whether the rewrite operation has succeeded or not.

By such a structure and an operation, the following three effects can be obtained. Firstly, in the case of large characteristic variation of the memory cells, the rewrite operation can be exactly performed in the phase-change memory by applying the verify read operation. Secondly, a peak value of consumption current can be suppressed by suppressing the number of bytes to be simultaneously rewritten. Thirdly, an increased portion of the verify read time can be suppressed by simultaneously reading the memory cells larger than the number of bytes to be simultaneously rewritten.

Fifth Embodiment

Figure 19:
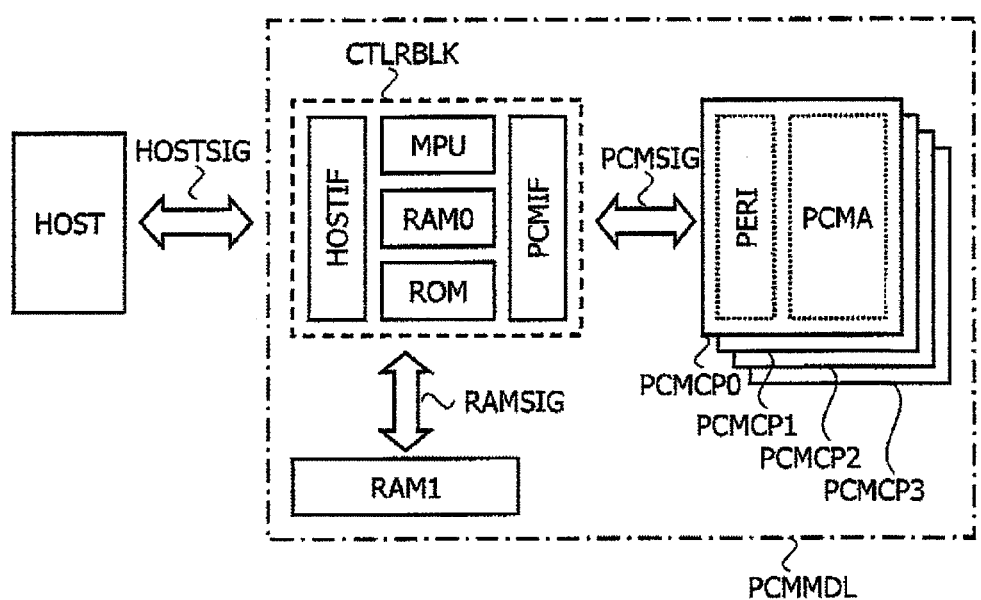
FIG. 19 is a diagram showing an example of a structure of a phase-change memory module in a semiconductor device of a fifth embodiment of the present invention.

The present embodiment describes an example of a structure of a memory module to which the cell array of the phase-change memory described in the previous first to fourth embodiments is applied, with reference to FIG. 19. A present memory module PCMMDL is configured of: phase-change memories PCMCP0 to PCMCP3; an external random access memory RAM1; and a controller block CTLRBLK. Each of the phase-change memories PCMCP0 to PCMCP3 is configured of: a phase-change memory array PCMA; and a peripheral circuit PERI. The phase-change memory array PCMA has a circuit structure shown in, for example, FIG. 1. The peripheral circuit PERI includes an input/output circuit which exchanges storage information, an address, and a command, an address decode circuit, a power supply circuit, or others.

The external random access memory RAM1 is an SRAM (static random access memory) or a DRAM (dynamic random access memory). The controller block CTLRBLK is configured of: a micro processor unit MPU; a random access memory RAM0; a read-only memory ROM; a phase-change memory interface PCMIF; and a host device interface HOSTIF. The random access memory RAM0 is an SRAM or a DRAM. The external random access memory RAM1 and the random access memory RAM0 temporarily store storage information read from the phase-change memories PCMCP0 to PCMCP3 and information to be newly written in the phase-change memories PCMCP0 to PCMCP3. Programs for Wear leveling, error correction, and others are stored in the read-only memory ROM. The micro processor unit MPU reads this program to execute the Wear leveling. Each unit of the controller CTLR is connected to the phase-change memories PCMCP0 to PCMCP3 from the phase-change memory interface PCMIF via the phase-memory signal group PCMSIG. Also, it is connected to the external random access memory RAM1 via a RAM signal group RAMSIG. Further, it is connected from the host device interface HOSTIF to a host device HOST via a host device signal group HOSTSIG. Based on an instruction transferred from the host device HOST, the controller block CTLRBLK issues a command shown in FIG. 2 to output the data to the phase-change memory interface PCMIF and adjust the timing of the data transfer to the phase-change memories PCMCP0 to PCMCP3.

By the structure and the function as described above, a large-capacity and highly-reliable memory module can be achieved. Also, since the command and the data transferred from the host device HOST are inputted to the phase-change memories PCMCP0 to PCMCP3 via the controller block CTLRBLK, it is not required to transmit the command shown in FIG. 2 directly from the host device HOST. The controller block CTLRBLK can also determine from the command and the data transferred from the host device HOST to transmit the command shown in FIG. 2 to the phase-change memories PCMCP0 to PCMCP3. Further, the controller block CTLRBLK generates the command shown in FIG. 2 in accordance with the command transferred from the host device HOST, and transmits the command to the phase-change memories PCMCP0 to PCMCP3. Still further, the controller block CTLRBLK adjusts the timing so as to satisfy the timing charts shown in FIGS. 6, 9, 11, and 14 to exchange the data. By this, the host device HOST side can use the commands used in the conventional storage device. Therefore, compatibility of the input/output interface of the storage device is maintained, so that a mounting cost of the semiconductor device according to the present invention can be suppressed.

In the foregoing, the invention made by the inventors has been concretely described based on the embodiments. However, it is needless to say that the present invention is not limited to the foregoing embodiments and various modifications and alterations can be made within the scope of the present invention. For example, the structure and the operation in which the read/write operation time, that is, the page size, is controlled in accordance with the inputted command signal are described above. However, means for controlling the operation time is not limited to the command signal. For example, phase-change memory chips each having a different page size can be manufactured by a bonding option. However, since the page size is fixed in such a chip, there is a risk that application circumstances are limited. Therefore, in order to improve convenience for users, a chip structure such that the page size can be changed after shipping is to be provided, and it is desired that the page size can be changed in accordance with the command signal as described in the first embodiment.

FIG. 8 has described the operation of writing the information, which is temporarily stored in the storage information register group SDRBK, in the memory cells on the different word lines as sequentially activating the plurality of global word lines. However, the destinations of the rewriting are not limited to the memory cells on the different word lines but may be memory cells on the same word line at crossing points with different bit lines. Such an operation can be achieved by sequentially selecting the plurality of bit lines by using the bit-line selection circuit MUX. Also, even when the same word line is selected to perform the writing, there is the method of sequentially writing in different memory tiles. For example, the global word line GWL00 is selected, and then, the global word line GWL10 in the different memory tile is selected. In this manner, heat generation inside the memory cells is further dispersed, so that heat disturbance in adjacent cells can be eased.

Also, FIG. 17 has explained the structure of the phase-change memory including four memory areas. However, the number of memory areas is not particularly limited. For example, in order to shorten the length of the global bit line and the length of the global word line to increase the speed of the large-capacity phase-change memory, the number of memory tiles can be appropriately adjusted to provide a chip structure including eight memory areas. Further, FIG. 17 has described the structure in which the memory area control circuit MARCTL is arranged in each of the four memory areas. However, for example, a structure may be provided, in which the adjacent memory areas ULMAR and URMAR share one memory area control circuit. By such a structure, the number of circuit blocks can be reduced, and therefore, the chip area size can be suppressed.

Note that the present invention can be applied to not only a single memory chip but also an on-chip memory. Also, the concept of the present invention has been described on the premise of the phase-change memory using the chalcogenide material for the storage element. However, the material of the storage element is not limited, and the present invention can be applied to not only the phase-change memory but also various semiconductor memories such as a magnetoresistive random access memory and a resistive memory not requiring the block erase operation.

SYMBOL EXPLANATION

PCMCP AND PCMCP0 TO PCMCP3: PHASE-CHANGE MEMORY
IOBF: INPUT/OUTPUT BUFFER
EXIO: EXTERNAL INPUT/OUTPUT LINE
INIO: INTERNAL INPUT/OUTPUT LINE
UMAR, LMAR, ULMAR, URMAR, LLMAR, AND LRMAR: MEMORY AREA
MP: MEMORY PLANE
SMP0 TO SMPx: SMALL-SCALE MEMORY PLANE
SWBK: SENSE LATCH/REWRITE DRIVING CIRCUIT GROUP
SWM0 TO SWMx: SMALL-SCALE SENSE LATCH/REWRITE DRIVING CIRCUIT GROUP
MARCTL: MEMORY AREA CONTROL CIRCUIT
MGBL: GLOBAL BIT LINE GROUP
MGBL0 TO MGBLx: SMALL-SCALE GLOBAL BIT LINE GROUP
SDRBK: STORAGE INFORMATION REGISTER GROUP
SDR0 TO SDRy: SMALL-SCALE STORAGE INFORMATION REGISTER GROUP
ZBR0 TO ZBRx: z-BYTE REGISTER
MARCTL: MEMORY AREA CONTROL CIRCUIT
CPCTL: CHIP CONTROL CIRCUIT
INADD: INTERNAL ADDRESS
IX, IXm0 TO IXm7: INTERNAL ROW ADDRESS
IY, IY0U TO IY1023U, IY0L TO IY1023L: INTERNAL COLUMN ADDRESS
RWSIG: READ/WRITE CONTROL SIGNAL
GWIEU AND GWIEL: GLOBAL STORAGE INFORMATION REGISTER START SIGNAL
GWEU AND GWEL: GLOBAL REWRITE START SIGNAL
GROEU AND GROEL: GLOBAL STORAGE INFORMATION REGISTER START SIGNAL
GREU AND GREL: GLOBAL READ START SIGNAL
MGWL: GLOBAL WORD LINE GROUP
MGWL0 TO MGWLm: SMALL-SCALE GLOBAL WORD LINE GROUP
MRWESIG: READ/WRITE START SIGNAL GROUP
RE: READ START SIGNAL
WE AND WE0 TO WE7: REWRITE START SIGNAL
MDRESIG: STORAGE INFORMATION REGISTER START SIGNAL GROUP
WIE: STORAGE INFORMATION INPUT START SIGNAL
WOE: STORAGE INFORMATION OUTPUT START SIGNAL
RIE: STORAGE INFORMATION INPUT START SIGNAL
ROE: STORAGE INFORMATION OUTPUT START SIGNAL
CPCTL: CHIP CONTROL CIRCUIT
ADDCTL: ADDRESS CONTROL CIRCUIT
CRCL: COMMAND REGISTER/CONTROL LOGIC CIRCUIT
VRGT: VOLTAGE GENERATION CIRCUIT
ADEC: ADDRESS DECODER
AREG: START ADDRESS REGISTER
AGEG: ADDRESS GENERATION CIRCUIT
PGL1, PGL2, PGS1, PGS2, RDL1, RDL2, AND RDS: COMMAND SIGNAL
MDL: DATA LINE GROUP
MDL0 TO MDLx: SMALL-SCALE DATA LINE GROUP
MT00 TO MTmn: MEMORY TILE
MC00 TO MCjk: MEMORY CELL
MUX: BIT-LINE SELECTION CIRCUIT
WD0 TO WDj: WORD DRIVER
SL0 TO SLn: SENSE LATCH
WDC0 TO WDCn: REWRITE DRIVING CIRCUIT
CLE: COMMAND LATCH START SIGNAL
CEB: CHIP START SIGNAL

ALE: ADDRESS LATCH START SIGNAL
WEB: WRITE START SIGNAL
CA1 AND CA2: START COLUMN ADDRESS
RA1, RA2, AND RA3: START ROW ADDRESS
D0 TO D2047: STORAGE INFORMATION
RBB: READY/BUSY SIGNAL
REB: READ START SIGNAL
TWAL AND TWAS: WRITE ADDRESS INPUT TIME
TRAL AND TRAS: READ ADDRESS INPUT TIME
TWRL AND TWRS: WRITE DATA STORAGE TIME
TRRL AND TRRS: READ DATA STORAGE INFORMATION
TWBL AND TWBS: WRITE BUSY TIME
TRBL AND TRBS: READ BUSY TIME
TWCL AND TWCS: WRITE ACCESS CYCLE TIME
TRCL AND TRCS: READ ACCESS CYCLE TIME
TPGL AND TPGS: WRITE OPERATION TIME
TRDL AND TRDS: READ OPERATION TIME
PCMMDL: MEMORY MODULE
RAM0: RANDOM ACCESS MEMORY
RAM1: EXTERNAL RANDOM ACCESS MEMORY
CTLRBLK: CONTROLLER BLOCK
PCMA: PHASE-CHANGE MEMORY ARRAY
PERI: PERIPHERAL CIRCUIT
MPU: MICRO PROCESSOR UNIT
ROM: READ-ONLY MEMORY
PCMIF: PHASE-CHANGE MEMORY INTERFACE
HOSTIF: HOST DEVICE INTERFACE
PCMIF: PHASE-CHANGE MEMORY INTERFACE
PCMSIG: PHASE-CHANGE MEMORY SIGNAL GROUP
RAMSIG: RAM SIGNAL GROUP
HOTSIG: HOST DEVICE SIGNAL GROUP
HOST: HOST DEVICE

The invention claimed is:

1. A semiconductor device comprising:
a memory plane which includes a plurality of bit lines, a plurality of word lines crossing the plurality of bit lines, and a plurality of memory cells arranged at predetermined crossing points of the plurality of bit lines and the plurality of word lines;
an input buffer to which an operation setting command, a data, and an address are inputted, the operation setting command setting an operation for the memory plane, the data being stored in the plurality of memory cells, and the address corresponding to the data;
a memory area control circuit which controls to write the data into the memory plane in accordance with the address inputted to the input buffer; and
a page size register which is set as a first rewrite mode or a second rewrite mode in accordance with the operation setting command inputted to the input buffer;
a ready/busy signal line; and
a block erase register which is set as a block erase mode in a case that a block erase command is inputted to the input buffer,
the memory plane including a first information storage area and a second information storage area, wherein
first access cycle time is shorter than second access cycle time, the first access cycle time taken from input of the operation setting command in the case that the page size register is set as the first rewrite mode, followed by end of the rewrite operation into the memory plane, until input of a next operation setting command, and the second access cycle time taken from input of the operation setting command in the case that the page size register is set as the second rewrite mode, followed by end of the rewrite operation into the memory plane, until input of a next operation setting command,
the memory area control circuit writes the data into the first information storage area and activates the ready/busy signal line during first busy time in a case that the page size register is set as the first rewrite mode and an address indicating the first information storage area is inputted to the input buffer,
the memory area control circuit writes the data into both of the first information storage area and the second information storage area and activates the ready/busy signal line during second busy time in a case that the page size register is set as the second rewrite mode and an address indicating the first information storage area is inputted to the input buffer,
the memory area control circuit activates the ready/busy signal line during third busy time in a case that the block erase register is set as the block erase mode,
the first busy time is shorter than the second busy time, and the third busy time is shorter than the first busy time.

2. The semiconductor device according to claim 1, wherein
the memory plane further includes: a plurality of memory tile areas which are arranged in array in a first direction where the plurality of word lines extend and a second direction crossing the first direction; a plurality of global word lines which extend in the first direction; and a plurality of global bit lines which extend in the second direction,
each of the plurality of memory tile areas includes: a predetermined number of word lines among the plurality of word lines; a predetermined number of bit lines among the plurality of bit lines; a plurality of word drivers which are connected respectively to the predetermined number of word lines; and a bit-line selection circuit which is connected to the predetermined number of bit lines,
the plurality of global word lines are commonly connected respectively to the plurality of word drivers included in the plurality of memory tile areas aligned in the first direction,
the plurality of global bit lines are commonly connected respectively to a plurality of bit-line selection circuits included in the plurality of memory tile areas aligned in the second direction, and
writing is performed to one memory cell inside one of the memory tile areas by selecting one of the plurality of global word lines and selecting one of the predetermined number of bit lines connected to the bit-line selection circuit in a first write period.

3. The semiconductor device according to claim 2, wherein,
in the first write period, the plurality of bit-line selection circuits included in the plurality of memory tile areas corresponding to the selected global word line parallely select one of the predetermined number of bit lines.

4. The semiconductor device according to claim 2, wherein the plurality of memory tile areas aligned in the first direction are divided into a plurality of memory tile area groups including first and second memory tile area groups, and,
in the first write period, data is written into a memory cell included in the first memory tile area group, and then, data is written into a memory cell included in the second memory tile area group.

5. The semiconductor device according to claim 4, wherein the data is written into the first and second memory tile area groups, and then, the data is parallely read from the first and second memory tile area groups to perform a verify operation.

6. The semiconductor device according to claim 1, wherein the semiconductor device includes two or more memory planes, and
the data inputted to the input buffer is divided into pieces of data as many as the memory planes, and the two or more memory planes parallely perform a write operation.

7. The semiconductor device according to claim 6, wherein the data inputted to the input buffer is divided into pieces of data by a unit of the number of bits to be written into the plurality of memory tile areas in the first write period, and every unit of the number of bits to be written into the plurality of memory tile areas is sequentially transferred to the two or more memory planes.

8. The semiconductor device according to claim 1, wherein the memory area control circuit controls the number of times of generation of an internal address for selecting the plurality of word lines, based on the rewrite mode set in the page size register.

9. A semiconductor device comprising:
a first memory plane which includes a plurality of first global bit lines, a plurality of first bit-line selection circuits connected respectively to the plurality of first global bit lines, a plurality of first bit lines connected respectively to the plurality of first bit-line selection circuits, a plurality of first word lines crossing the plurality of first bit lines, and a plurality of first memory cells arranged at predetermined crossing points of the plurality of first bit lines and the plurality of first word lines;
a plurality of first write driving circuits which are connected to the plurality of first global bit lines;
an input buffer to which a rewrite command and a data are inputted, the rewrite command indicating a rewrite mode for the first memory plane, and the data being stored in the plurality of first memory cells;
a first storage information register group which is connected to the plurality of first write driving circuits and which includes a first small-scale storage information register group and a second small-scale storage information register group for temporarily retaining the data inputted to the input buffer; and
a page size register which is set as a first rewrite mode or a second rewrite mode in accordance with the rewrite command, wherein
a data volume retained in the first storage information register group in the case that the page size register is set as the first rewrite mode is smaller than a data volume retained in the first storage information register group in the case that the page size register is set as the second rewrite mode,
in the case that the page size register is set as the first rewrite mode, the data inputted to the input buffer is stored in the first small-scale storage information register group, and is transferred from the first small-scale storage information register group to the plurality of first write driving circuits, and,
in the case that the page size register is set as the second rewrite mode, the data inputted to the input buffer is stored in the first small-scale storage information register group and the second small-scale storage information register group, and is transferred from the first small-scale storage information register group to the plurality of first write driving circuits, and then, is transferred from the second small-scale storage information register group to the plurality of first write driving circuits.

10. The semiconductor device according to claim 9, wherein
the first memory plane further includes: a plurality of first word drivers connected to the plurality of first word lines; and a plurality of first global word lines connected to the plurality of first word drivers,
the plurality of first word drivers are divided into a plurality of first word driver groups so as to correspond to the plurality of first bit-line selection circuits, respectively,
the first memory plane further includes a plurality of first memory tile areas sectioned by one of the plurality of first bit-line selection circuits and one of the plurality of first word driver groups,
the plurality of first global word lines are commonly connected respectively to a plurality of first word drivers included in a plurality of first memory tile areas aligned in a first direction where the plurality of first word lines extend,
the plurality of first global bit lines are commonly connected respectively to a plurality of first bit-line selection circuits included in a plurality of first memory tile areas aligned in a second direction crossing the first direction, and,
in a first write period, writing is performed to one memory cell inside one of the memory tile areas by selecting one of the plurality of first global word lines and selecting one of the plurality of first bit lines.

11. The semiconductor device according to claim 10, wherein,
in the first write period, the retained data is parallely transferred from one of the first and second small-scale storage information register groups to the plurality of first write driving circuits,
the plurality of first write driving circuits parallely drive the plurality of first bit-line selection circuits in accordance with the transferred data, and
a plurality of first bit-line selection circuits included in the plurality of first memory tile areas aligned in the first direction select one of the plurality of first bit lines which parallely correspond thereto.

12. The semiconductor device according to claim 10, wherein
the plurality of first write driving circuits are divided into a plurality of write driving circuit groups including first and second write driving circuit groups, and,
in the first write period, data is written into a memory cell corresponding to the first write driving circuit group, and then, data is written into a memory cell corresponding to the second write driving circuit group.

13. The semiconductor device according to claim 12, wherein
data is written into the first and second memory tile area groups, and then, data is parallely read from the first and second memory tile area groups to perform a verify operation.

14. The semiconductor device according to claim 9, wherein
the semiconductor device further includes:
a second memory plane which includes a plurality of second global bit lines, a plurality of second bit-line selection circuits connected respectively to the plurality of second global bit lines, a plurality of second bit lines connected respectively to the plurality of second bit-line selection circuits, a plurality of second word lines crossing the plurality of second bit lines, a plurality of second memory cells arranged at predetermined crossing points of the plurality of second bit lines and the plurality of second word lines; and a second storage information register group which is connected to the plurality of second write driving circuits and which includes a third small-scale storage information register group and a fourth small-scale storage information register group for temporarily retaining the data inputted to the input buffer, in the first rewrite mode, the data inputted from the input buffer is stored in the first small-scale storage information register group and the third small-scale storage information register group, and the data is parallely written into the first memory plane and the second memory plane, and in the second rewrite mode, the data inputted from the input buffer is stored in the first to fourth small-scale storage information register groups, and the data stored in the first and third small-scale storage register groups is parallely written into the first memory plane and the second memory plane, and the data stored in the second and fourth small-scale storage register groups is parallely written into the first memory plane and the second memory plane.

15. The semiconductor device according to claim 14, wherein, in performing the parallel read and write operations, the data inputted to the input buffer is divided into pieces of data by a unit of the number of bits to be written into the plurality of memory tiles in the first write period, and the pieces of data are transferred to two or more memory planes in a predetermined sequence.

16. The semiconductor device according to claim 9, wherein the number of bits of each of the first and second small-scale storage information register groups is equal to the number of the plurality of write driving circuits, each of the bits of the first small-scale storage information register group is connected to one of the plurality of first write driving circuits, and each of the bits of the second small-scale storage information register group is connected to one of the plurality of first write driving circuits.

17. The semiconductor device according to claim 9, wherein the memory area control circuit controls the number of times of generation of an internal address for selecting the plurality of word lines, based on the rewrite mode set in the page size register.

* * * * *